United States Patent
Wells et al.

(10) Patent No.: US 10,812,695 B2
(45) Date of Patent: Oct. 20, 2020

(54) THREE-DIMENSIONAL POSITIONING SYSTEM USING SURFACE PATTERN RECOGNITION AND INTERPOLATION

(71) Applicant: NIKON CORPORATION, Tokyo (JP)

(72) Inventors: Jonathan K. Wells, San Francisco, CA (US); Matthew D. Rosa, Fremont, CA (US); Paul Derek Coon, Redwood City, CA (US); Eric Peter Goodwin, Tucson, AZ (US)

(73) Assignee: Nikon Corporation (JP)

( * ) Notice: Subject to any disclaimer, the term of this patent is extended or adjusted under 35 U.S.C. 154(b) by 589 days.

(21) Appl. No.: 15/264,108

(22) Filed: Sep. 13, 2016

(65) Prior Publication Data

US 2017/0076439 A1    Mar. 16, 2017

Related U.S. Application Data

(60) Provisional application No. 62/218,479, filed on Sep. 14, 2015.

(51) Int. Cl.
    *H04N 5/225*      (2006.01)
    *H04N 13/243*      (2018.01)
    (Continued)

(52) U.S. Cl.
    CPC ......... *H04N 5/2256* (2013.01); *G01B 11/002* (2013.01); *G03F 7/70775* (2013.01);
    (Continued)

(58) Field of Classification Search
    CPC . G01B 11/002; G03F 7/70775; H04N 13/239; H04N 13/243; H04N 2013/0085; H04N 5/2254; H04N 5/2256
    (Continued)

(56) References Cited

U.S. PATENT DOCUMENTS 5,698,861 A    12/1997   Oh
5,925,956 A    7/1999   Ohzeki
(Continued)

OTHER PUBLICATIONS

"How do optical mice work?" May 8, 2001. HowStuffWorks.com. <http://computer.howstuffworks.com/question631.htm>. The applicant admits that optical mice are prior art.

(Continued)

*Primary Examiner* — Christopher S Kelley
*Assistant Examiner* — Kathleen M Walsh
(74) *Attorney, Agent, or Firm* — Roeder & Broder LLP; Steven G. Roeder

(57) ABSTRACT

A measuring device (233) for monitoring movement of a first object relative to a second object, the first object or the second object including a target surface (13), comprises a first image sensor combination (236), a second image sensor combination (237), and a control system (20A). The image sensor combinations (236, 237) capture first images and second images of the target surface (13) over time. The first image sensor combination (236) includes a first image sensor (236A) and a first lens assembly (236B). The second image sensor combination (237) includes a second image sensor (237A), and a second lens assembly (237B) having a second optical axis (237BX) that is at an angle of between thirty degrees and sixty degrees relative to normal to the target surface (13). The control system (20A) analyzes the first images and the second images to monitor movement of the first object relative to the second object.

30 Claims, 14 Drawing Sheets

(51) Int. Cl.
  *G01B 11/00* (2006.01)
  *G03F 7/20* (2006.01)
  *H04N 13/239* (2018.01)
  *H04N 13/00* (2018.01)
(52) U.S. Cl.
  CPC ......... *H04N 5/2254* (2013.01); *H04N 13/239* (2018.05); *H04N 13/243* (2018.05); *H04N 2013/0085* (2013.01)
(58) Field of Classification Search
  USPC .......................................................... 348/87
  See application file for complete search history.

(56) References Cited

U.S. PATENT DOCUMENTS

| | | | |
|---|---|---|---|
| 6,094,269 A * | 7/2000 | Ben-Dove | G01B 5/205 250/559.22 |
| 6,249,591 B1 | 6/2001 | Tullis | |
| 6,570,104 B1 | 5/2003 | Ericson et al. | |
| 6,621,063 B2 | 9/2003 | McQueen | |
| 6,765,195 B1 | 7/2004 | Leviton | |
| 6,963,074 B2 | 11/2005 | McQueen | |
| 7,295,947 B2 | 11/2007 | Kurth et al. | |
| 7,617,070 B2 | 11/2009 | Kurth et al. | |
| 7,907,795 B2 | 3/2011 | Hardy et al. | |
| 7,999,841 B1 | 8/2011 | Stevens | |
| 2002/0079466 A1 | 6/2002 | Tahmi | |
| 2004/0130691 A1 | 7/2004 | Boonman | |
| 2005/0211885 A1* | 9/2005 | Tobiason | G01D 5/34723 250/231.13 |
| 2006/0055912 A1 | 3/2006 | Kurth | |
| 2007/0229788 A1* | 10/2007 | Kosugi | G03F 9/7003 355/53 |
| 2007/0246646 A1 | 10/2007 | Lum | |
| 2009/0012743 A1* | 1/2009 | McDonnell | G01B 9/02057 702/167 |
| 2010/0020180 A1* | 1/2010 | Hill | G06T 7/73 348/188 |
| 2010/0157276 A1 | 6/2010 | Shibazaki | |
| 2011/0164238 A1* | 7/2011 | Yoshimoto | G03F 7/70733 355/72 |
| 2011/0267594 A1* | 11/2011 | Kim | G03F 7/70475 355/67 |
| 2013/0141715 A1* | 6/2013 | Urano | G01N 21/47 356/237.2 |
| 2014/0168625 A1* | 6/2014 | Ito | G03F 7/70775 355/72 |
| 2014/0204358 A1 | 7/2014 | Yang et al. | |
| 2014/0232846 A1* | 8/2014 | Tanaka | G02B 21/365 348/79 |
| 2014/0368804 A1 | 12/2014 | Lafarre et al. | |
| 2015/0241525 A1 | 8/2015 | Yang et al. | |
| 2015/0301459 A1 | 10/2015 | Coon et al. | |
| 2018/0217510 A1 | 8/2018 | Wells et al. | |

OTHER PUBLICATIONS

Microsoft wireless laser mouse 7000 specifications: http://www.microsoft.com/hardware/en-us/d/wireless-laser-mouse-7000. The applicant admits that optical mice are prior art.
Office Action dated Oct. 1, 2018 by the U.S. Patent Office in U.S. Appl. No. 15/669,661.
Office Action issued by the U.S. Patent Office, dated Jul. 1, 2019, in U.S. Appl. No. 15/669,661, related matter.

* cited by examiner

THREE-DIMENSIONAL POSITIONING SYSTEM USING SURFACE PATTERN RECOGNITION AND INTERPOLATION

RELATED APPLICATION

This application claims priority on U.S. Patent Application Ser. No. 62/218,479, entitled "THREE-DIMENSIONAL POSITIONING SYSTEM USING SURFACE PATTERN RECOGNITION AND INTERPOLATION", filed on Sep. 14, 2015. As far as permitted, the contents of U.S. Patent Application Ser. No. 62/218,479 are incorporated herein by reference.

This application is related to U.S. patent application Ser. No. 14/689,570, entitled "POSITIONING SYSTEM USING SURFACE PATTERN RECOGNITION AND INTERPOLATION", filed on Apr. 17, 2015. As far as permitted, the contents of U.S. patent application Ser. No. 14/689,570 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that retains and positions a reticle, a lens assembly, a wafer stage assembly that retains and positions a semiconductor wafer, and a measurement system that monitors the position or movement of the reticle and the wafer.

One or both of the stage assemblies are often required to operate over a relatively large area. This can make the monitoring of the position and/or movement of the stage assembly difficult.

SUMMARY

The present invention is directed toward a measuring device for monitoring movement of a first object relative to a second object along a first axis, along a second axis that is orthogonal to the first axis, and along a third axis that is orthogonal to the first and second axes, at least one of the first object and the second object including a target surface. In various embodiments, the measuring device comprises a first image sensor combination, a second image sensor combination, and a control system. The first image sensor combination captures a plurality of first images of the target surface. The first image sensor combination includes a first image sensor and a first lens assembly. The second image sensor combination captures a plurality of second images of the target surface. The second image sensor combination includes a second image sensor and a second lens assembly. The second lens assembly has a second optical axis that is at a predetermined angle relative to normal to the target surface. The control system includes a processor that analyzes the first images and the second images to monitor movement of the first object relative to the second object along the first axis, the second axis, and the third axis.

In certain embodiments, the second optical axis is at an angle of between thirty degrees and sixty degrees relative to normal to the target surface. Additionally, in some such embodiments, the second optical axis is at an angle of between forty degrees and fifty degrees relative to normal to the target surface. Further, in one non-exclusive such embodiment, the second optical axis is at an angle of forty-five degrees relative to normal to the target surface.

In certain embodiments, the first lens assembly includes a first lens and a spaced apart second lens, the first lens assembly having a doubly telecentric configuration. Additionally, the second lens assembly can include a third lens and a spaced apart fourth lens, the second lens assembly also having a doubly telecentric configuration.

Additionally, in some embodiments, the first lens assembly has a first optical axis that is perpendicular to the target surface. Alternatively, in certain embodiments, the first lens assembly has a first optical axis that is at an angle of between thirty degrees and sixty degrees relative to normal to the target surface. Additionally and/or alternatively, the measuring device can further comprise a third image sensor combination that captures a plurality of third images of the target surface over time. The third image sensor combination can including a third image sensor and a third lens assembly that are secured to one of the first object and the second object. The third lens assembly can have a third optical axis that is at an angle of between thirty degrees and sixty degrees relative to normal to the target surface. In such embodiments, the measuring device can further monitor movement of the first object relative to the second object about the first axis, about the second axis, and about the third axis.

The measuring device can further comprise a light source that directs a light beam toward the target surface to illuminate at least a portion of the target surface.

The present invention is also directed toward a stage assembly for positioning a device along a first axis, along a second axis that is orthogonal to the first axis, and along a third axis that is orthogonal to the first and second axes. In certain embodiments, the stage assembly comprises a base having a target surface, a stage that retains the device, a mover assembly that moves the stage relative to the base, and a first sensor system including the measuring device as described that monitors movement of the stage relative to the target surface along the first axis, along the second axis and along the third axis. The stage assembly can further comprise a second sensor system that senses the position of the stage relative to the target surface along the first axis, along the second axis and along the third axis, the second sensor system having a different design than the first sensor system.

The present invention is further directed toward an exposure apparatus, a process for manufacturing a device utilizing the exposure apparatus, and a method for monitoring movement of a first object relative to a second object along a first axis, along a second axis that is orthogonal to the first axis, and along a third axis that is orthogonal to the first and second axes, at least one of the first object and the second object including a target surface.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
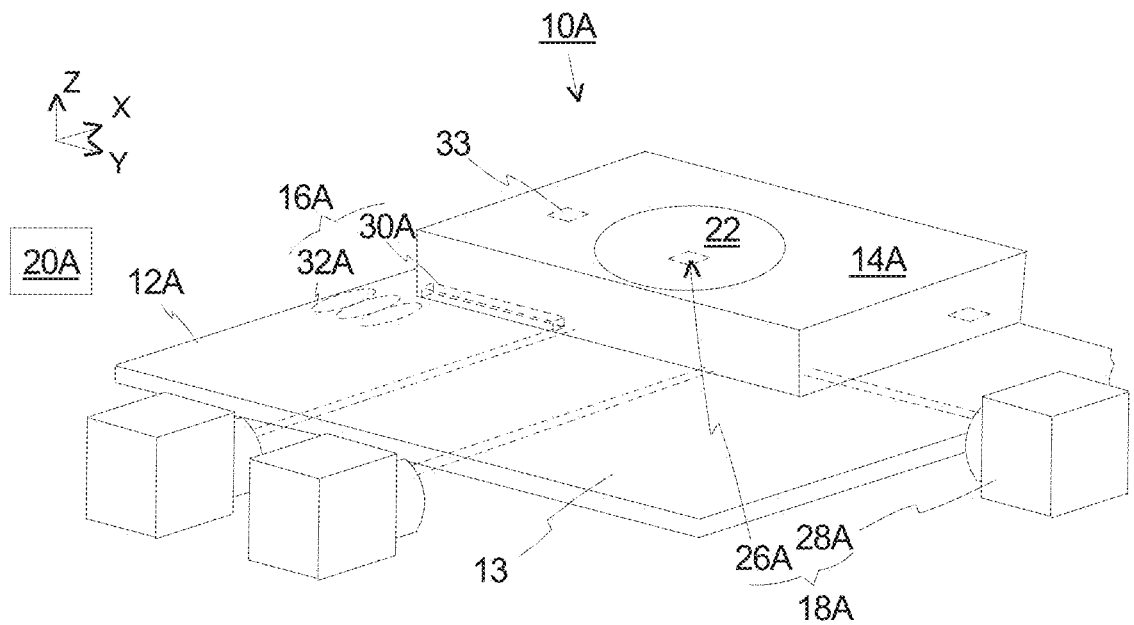
FIG. 1A is a simplified perspective view of a stage assembly having features of the present invention.

FIG. 1A is a simplified perspective illustration of a stage assembly 10A that includes a base 12A, a stage 14A, a stage mover assembly 16A (only a portion is illustrated in phantom), a measurement system 18A, and a control system 20A (illustrated as a box). The design of each of these components can be varied to suit the design requirements of the stage assembly 10A. The stage assembly 10A is particularly useful for precisely positioning a device 22 during a manufacturing and/or an inspection process. The type of device 22 positioned and moved by the stage assembly 10A can be varied. For example, the device 22 can be a semiconductor wafer, or a reticle, and the stage assembly 10A can be used as part of an exposure apparatus 924 (illustrated in FIG. 9) for precisely positioning the wafer or the reticle during manufacturing of the semiconductor wafer. Alternatively, for example, the stage assembly 10A can be used to move other types of devices during manufacturing and/or inspection, to move a device under an electron microscope (not shown), or to move a device during a precision measurement operation (not shown).

It should be noted that an upper surface 13 of the base 12A that faces the stage 14A can also be referred to as a "target surface". Alternatively, a bottom surface of the stage 14A that faces the upper surface 13 of the base 12A can be referred to and/or function as a "target surface".

As an overview, in certain embodiments, the measurement system 18A utilizes both a first sensor system 26A (only a portion is illustrated in phantom), and a second sensor system 28A (only a portion is shown in the Figures) that cooperate to monitor the position and/or movement of the stage 14A. The second sensor system 28A is of a different design and/or type than the first sensor system 26A. In certain embodiments, the first sensor system 26A has a first sensor accuracy that is less than a second sensor accuracy of the second sensor system 28A. It should be appreciated, however, that the measurement system 18A need not be utilized for monitoring the position and/or movement of a stage 14A relative to a base 12A. More specifically, the measurement system 18A can be utilized to monitoring the position and/or movement of any first object relative to a second object.

In certain embodiments, the second sensor system 28A is used in the primary control of the stage mover assembly 16A. Additionally, in some embodiments, the first sensor system 26A can be used during system initialization and/or when the signal from the second sensor system 28A is lost or is otherwise unavailable. Further, the first sensor system 26A can be used when less accuracy is required.

Additionally, although in certain embodiments the first sensor system 26A requires less sensor accuracy than the second sensor system 28A, it can still be desired to have the first sensor system 26A accurately measure the movement and/or position of the stage 14A along the X axis, along the Y axis, and along the Z axis. As provided herein, the problem of a two-dimensional X and Y positioning system being unable to measure a third spatial position, Z, is solved by adding an angled lens and image sensor arrangement relative to the normal of the X-Y working surface, i.e. the target surface 13, such that it sees a Z motion that is coupled to X or Y motion.

For example, in one embodiment, the first sensor system 26A includes (i) a first image sensor 236A (illustrated in FIG. 2A) and a first lens assembly 236B (illustrated in FIG. 2A) that is aligned at a first angle 236C (illustrated in FIG. 2A) that is substantially normal, i.e. perpendicular, to the target surface 13 to measure motion in the X and Y directions by reading a printed target pattern on the target surface 13, and (ii) a second image sensor 237A (illustrated in FIG. 2A) and a second lens assembly 237B (illustrated in FIG. 2A) that aligned at a second angle 237C (illustrated in FIG. 2A) relative to the normal axis of the target surface 13 that detects a total motion that is X or Y and Z coupled together. As provided herein, the coupled motion measured by the second image sensor 237A can be decoupled using the data from the first image sensor 236A and, thus, a Z measurement can be obtained. Moreover, as provided herein, the ability of the first sensor system 26A to accurately monitor relative movement and/or position between the stage 14A and the target surface 13 is further enhanced by the specific use of a doubly telecentric lens design in the three-dimensional sensing system based on surface pattern recognition.

Some of the Figures provided herein include an orientation system that designates an X axis, a Y axis that is orthogonal to the X axis, and a Z axis that is orthogonal to the X and Y axes. In these Figures, the Z axis is oriented in the vertical direction. It should be understood that the orientation system is merely for reference and can be varied. For example, the X axis can be switched with the Y axis and/or the stage assembly 10 can be rotated. Moreover, it should be noted that any of these axes can also be referred to as a first, a second, and/or a third axis.

In the embodiments illustrated herein, the stage assembly 10A includes a single stage 14A that retains the device 22. Alternatively, for example, the stage assembly 10A can be designed to include multiple stages that are independently moved and monitored with the measurement system 18A.

The base 12A is coupled to the stage mover assembly 16A, receives the reaction forces generated by the stage mover assembly 16A, and can be any suitable structure. In FIG. 1A, the base 12A is generally rectangular shaped and is rigid. In certain embodiments, the base 12A can be a reaction assembly that counteracts, reduces and minimizes the influence of the reaction forces from the stage mover assembly 16A on the position of other structures. For example, the base 12A can be a rigid, rectangular-shaped countermass that is maintained above a countermass support (not shown) with a reaction bearing (not shown) that allows for motion of the base 12A relative to the countermass support along the X axis, along the Y axis and about the Z axis. For example, the reaction bearing can be a vacuum preload type fluid bearing, a magnetic type bearing, or a roller bearing type assembly. Alternatively, for example, the stage assembly 10A can include a reaction frame (not shown), that couples the stage mover assembly 16A to the base 12A or another structure.

With the present design, (i) movement of the stage 14A with the stage mover assembly 16A along the X axis, generates an equal and opposite X reaction force that moves the base 12A in the opposite direction along the X axis; (ii) movement of the stage 14A with the stage mover assembly 16A along the Y axis, generates an equal and opposite Y reaction force that moves the base 12A in the opposite direction along the Y axis; and (iii) movement of the stage 14A with the stage mover assembly 16A about the Z axis generates an equal and opposite theta Z reaction moment (torque) that moves the base 12A about the Z axis. Additionally, any motion of the stage 14A with respect to the base 12A when away from the center of mass of the base 12A will tend to produce a reaction moment in the Z direction on the base 12A that will tend to rotate the base 12A about the Z axis.

The stage 14A retains the device 22. In one embodiment, the stage 14A is precisely moved by the stage mover assembly 16A to precisely position the stage 14A and the device 22. In FIG. 1A, the stage 14A is generally rectangular shaped and includes a device holder (not shown) for retaining the device 22. The device holder can be a vacuum chuck, an electrostatic chuck, or some other type of clamp.

The design of the stage mover assembly 16A can be varied to suit the movement requirements of the stage assembly 10. In the non-exclusive embodiment illustrated in FIG. 1A, the stage mover assembly 16A is a planar motor that moves the stage 14A along the X, Y, and Z axes, and about the X, Y, and Z axes (six degrees of freedom). In this embodiment, the first sensor system 26A monitors the movement and/or position of the stage 14A along the X, Y, and Z axes, and about the X, Y, and Z axes (six degrees of freedom); and the second sensor system 28A monitors the movement and/or position of the stage 14A along the X, Y, and Z axes, and about the X, Y, and Z axes (six degrees of freedom). Alternatively, the stage mover assembly 16A can be designed to move the stage 14A in fewer than six degrees of freedom.

In FIG. 1A, the stage mover assembly 16A is a planar motor that includes a magnet assembly 30A (only a portion is illustrated in phantom) that includes a plurality of spaced apart magnets (not shown), and a conductor assembly 32A (only a portion is illustrated in phantom) that includes a plurality of conductor units (not shown). Alternatively, for example, the stage mover assembly 16A can include one or more linear actuators, voice coil movers, or other types of actuators.

The measurement system 18A monitors the movement and/or the position of the stage 14A relative to a reference, such as an optical assembly 976 (illustrated in FIG. 9) of the exposure apparatus 924. With this information, the stage mover assembly 16A can be controlled by the control system 20A to precisely position the stage 14A. As provided herein, in certain embodiments, the measurement system 18A utilizes (i) the first sensor system 26A that monitors the movement and/or position of the stage 14A, and (ii) the second sensor system 28A that also monitors the movement and/or position of the stage 14A. The design of the measurement system 18A can be varied according to the movement requirements of the stage 14A.

The sensor systems 26A, 28A can vary. In the embodiment illustrated in FIG. 1A, the second sensor system 28A is an interferometer system. Further, in this embodiment, the first sensor system 26A includes a plurality of spaced apart image sensor assemblies 33 (illustrated as a box in phantom) that are fixedly attached to and/or integrated into the bottom of the stage 14A. As utilized herein, each of the image sensor assemblies 33 can also be referred to generally as a "measuring device". With this design, the image sensor assemblies 33 (or measuring devices) with the stage 14A move relative to the base 12A. Alternatively, in one embodiment, if the target surface is included as the bottom surface of the stage 14A, the image sensor assemblies 33 can be fixedly attached to and/or integrated into the base 12A.

The number and design of the image sensor assemblies 33 can vary. For example, in FIG. 1A, each image sensor assembly 33 (or measuring device) is able to monitor movement along each of the X, Y and Z axes. Thus, in certain embodiments, three or more image sensor assemblies 33 may be utilized to provide monitoring of the full movement of the stage 14A along the X, Y, and Z axes, and about the X, Y, and Z axes.

Further, if the first sensor system 26A only monitors movement of the stage 14A relative to the base 12A, another measurement system (not shown) may be necessary to monitor movement of the base 12A relative to the optical assembly 976 or another reference. However, in some embodiments, the first sensor system 26A itself can also be used to monitor movement of the base 12A relative to the optical assembly 976 or another reference. Further, the first sensor system 26A provided herein can be used in another type of stage assembly.

The control system 20A is electrically connected to the measurement system 18A, and utilizes the information from the first sensor system 26A and the second sensor system 28A to monitor and determine movement of the stage 14A. For example, the control system 20A can utilize second sensor signals from the second sensor system 28A and/or first sensor signals from the first sensor system 26A to monitor the movement of the stage 14A. The control system 20A is also electrically connected to, directs and controls electrical current to the stage mover assembly 16A to precisely position the device 22. With information regarding the movement and/or position of the stage 14A, i.e. from the second sensor system 28A and/or the first sensor system 26A, the control system 20A can direct current to the stage mover assembly 16A so that the stage 14A follows a known, desired trajectory. The control system 20A can be referred to as a computer, can include one or more processors and is programmed to perform one or more of the steps provided herein. Additionally, the control system 20A can include electronic data storage.

In one non-exclusive embodiment, the stage 14A can initially be controlled in all six degrees of freedom using the first sensor signals from the first sensor system 26A. In this embodiment, the stage 14A is controlled using the first sensor system 26A to take off slowly with a Z trajectory motion. Next, the stage 14A is controlled to rotate about the X, Y and Z axes using the first sensor system 26A until a good signal is received by the second sensor system 28A. Subsequently, the second sensor system 28A is reset. Next, the second sensor signals from the second sensor system 28A are used to control the movement of the stage 14A with six degrees of freedom. During operation of the stage assembly 10A, the first sensor system 26A can be used to control the stage mover assembly 16A in the event the signal from the second sensor system 28A is lost.

Figure 1B:
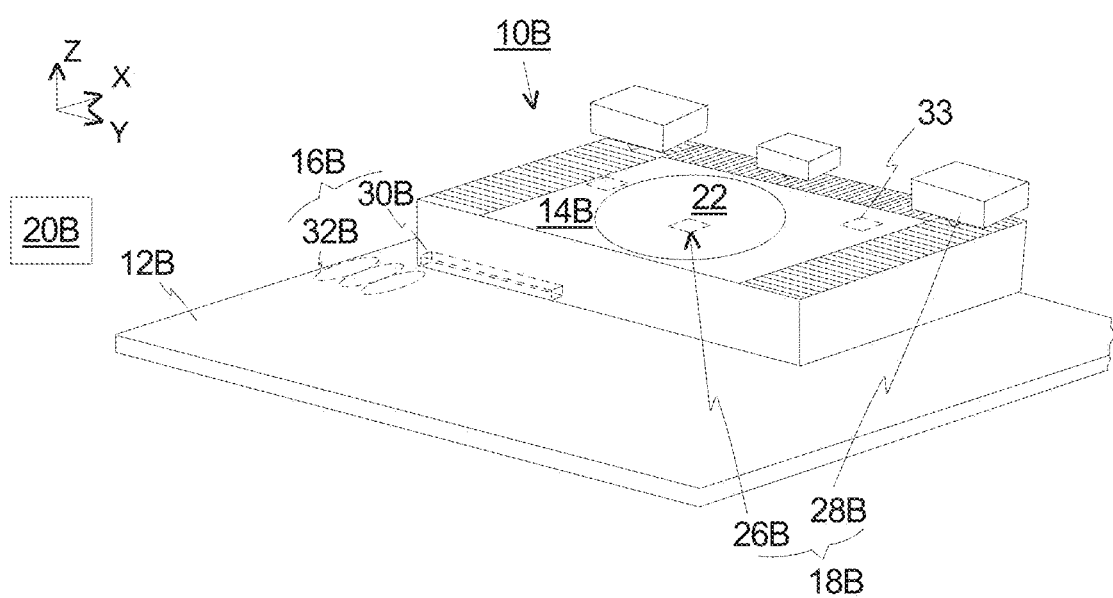
FIG. 1B is a simplified perspective view of another embodiment of a stage assembly having features of the present invention.

FIG. 1B is a simplified perspective view of another embodiment of a stage assembly 10B that includes a base 12B, a stage 14B, a stage mover assembly 16B including a magnet assembly 30B (only a portion is illustrated in phantom in FIG. 1B) and a conductor assembly 32B (only a portion is illustrated in phantom in FIG. 1B), and a control system 20B (illustrated as a box) that are similar to the corresponding components described above in reference to FIG. 1A. However, in this embodiment, the measurement system 18B is slightly different. More specifically, in this embodiment, the measurement system 18B again includes a first sensor system 26B including the plurality of image sensor assemblies 33 (only a portion is illustrated in phantom in FIG. 1B), and a second sensor system 28B (only a portion is illustrated in FIG. 1B). However, in this embodiment, the second sensor system 28B is an encoder assembly that includes one or more encoders that monitor the movement of the stage 12B along and about the first, second and third axes.

Figure 2A:
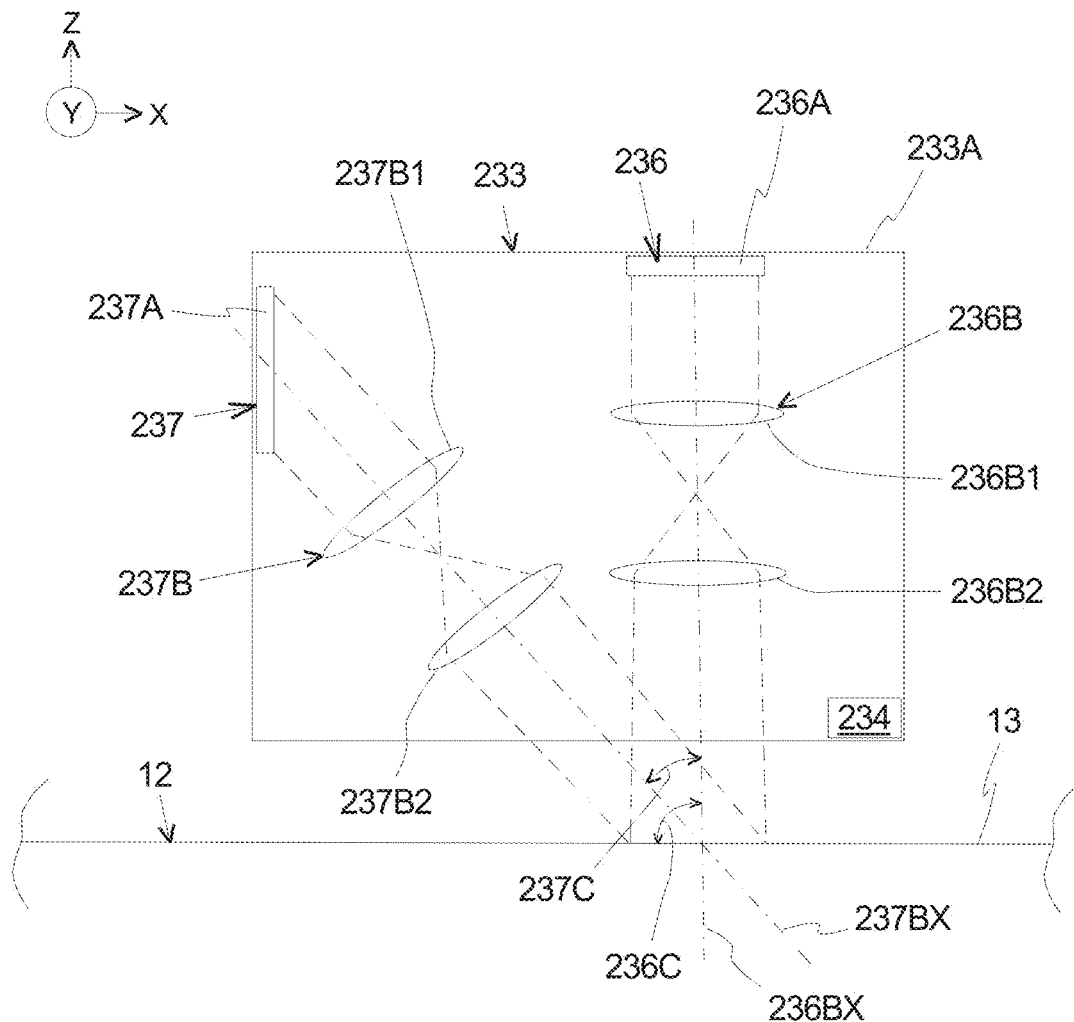
FIG. 2A is a simplified schematic side view illustration of an image sensor assembly having features of the present invention and a portion of a stage assembly.

FIG. 2A is a simplified schematic side view illustration of an image sensor assembly 233 (also referred to herein generally as a "measuring device"), and a portion of the base 12 including the target surface 13. In one embodiment, the image sensor assembly 233 (or measuring device) can be secured to and moves with the stage 14A, 14B (illustrated in FIGS. 1A and 1B, respectively) and the target surface 13 is part of the base 12. Alternatively, the image sensor assembly 233 can be secured to the base 12, and the target surface 13 can be part of the stage 14A, 14B.

In one embodiment, the image sensor assembly 233, i.e. the measuring device, includes an assembly housing 233A, a light source 234 (illustrated as a box), a first image sensor combination 236, and a second image sensor combination 237. As provided herein, each of the image sensor combinations 236, 237 are used to detect relative movement between the image sensor assembly 233 attached to the stage 14A and the target surface 13. More specifically, in the embodiment illustrated in FIG. 2A, the first image sensor combination 236 is used to detect relative movement between the image sensor assembly 233 and the target surface 13 along the X axis and the Y axis; and the second image sensor combination 237 is used to detect relative movement between the image sensor assembly 233 and the target surface 13 along the Y axis, with any detected relative movement along the X axis being coupled together with any relative movement along the Z axis. Alternatively, the second image sensor combination 237 can be positioned in a manner to detect relative movement between the image sensor assembly 233 and the target surface 13 along the X axis, with any detected relative movement along the Y axis being coupled together with any relative movement along the Z axis.

It should be appreciated that, based on the teachings provided herein, the image sensor assembly 233, i.e. the measuring device, can include a different number of image sensor combinations 236, 237 than are shown in the embodiment of FIG. 2A. For example, in certain non-exclusive alternative embodiments, the image sensor assembly 233 can include three or more image sensor combinations for purposes of monitoring the relative movement between the image sensor assembly 233 and the target surface 13.

The assembly housing 233A is rigid, can be substantially rectangular box-shaped, and can retain various components of the image sensor assembly 233. For example, as shown in FIG. 2A, all or part of the light source 234, the first image sensor combination 236 and the second image sensor combination 237 can be retained substantially within the assembly housing 233A. Alternatively, the assembly housing 233A can have a different design and/or a different shape.

The light source 234 directs light toward the target surface 13 to illuminate at least a portion of the target surface 13. The light from the light source 234 can enhance the ability of the first image sensor combination 236 and the second image sensor combination 237 to effectively capture images of the target surface 13.

In certain embodiments, the light source 234 can be an LED, a laser, or another type of light source that illuminates the target surface 13. Additionally, the light source 234 can be retained substantially within and/or be coupled to the assembly housing 233A. Further, in various applications, the light source 234 can be used in a pulsed and/or strobed manner to inhibit image blur that may otherwise be present if utilizing a continuous light source. Still further, in some such applications, the light source 234 can be pulsed and/or strobed in a manner that is synchronized with the operation of one or both of the image sensor combinations 236, 237.

The design and positioning of the first image sensor combination 236 can be varied to suit the specific requirements of the image sensor assembly 233. For example, as shown in FIG. 2A, the first image sensor combination 236 can include a first image sensor 236A that is coupled to and/or retained within the assembly housing 233A, and a first lens assembly 236B that is positioned in the optical path between the first image sensor 236A and the target surface 13.

Additionally, the design of the first image sensor 236A can be varied to suit the specific requirements of the first image sensor combination 236. For example, in some embodiments, the first image sensor 236A can be an optoelectronic sensor (essentially, a tiny low-resolution video camera) that includes a two-dimensional array of pixels that records light electronically. With this design, the first image sensor 236A captures successive, two-dimensional, first images of the target surface 13 over time as the stage 14A and the image sensor assembly 233 are moved relative to the target surface 13. Stated in another fashion, the image sensor assembly 233 captures multiple successive first images at regular intervals (e.g., thousands of images per second). Depending on how fast the stage 14A is being moved, each first image will be offset from the previous one by a fraction of a pixel or as many as several pixels. The control system 20A (illustrated in FIG. 1A) can process these first images using cross correlation to calculate how much each successive first image is offset from the previous one to determine the relative movement.

In one, non-exclusive embodiment, the image sensor assembly 233 has (i) a tracking speed=0.914 m/sec; (ii) an imaging rate=6000 frames per second; and (iii) a resolution=39.38 points per millimeter.

The first lens assembly 236B shapes and/or focuses the light between the target surface 13 and the first image sensor 236A. The design, positioning and orientation of the first lens assembly 236B can be varied depending on the requirements of the image sensor assembly 233. In the embodiment illustrated in FIG. 2A, the first lens assembly 236B includes a pair of spaced apart lenses, i.e. a first lens 236B1 and a second lens 236B2, that are spaced apart along the first optical axis 236BX, and that are positioned in the optical path between the target surface 13 and the first image sensor 236A.

Additionally, the first lens assembly 236B can have a first optical axis 236BX that is at a first angle 236C that is substantially normal (i.e. perpendicular) to the target surface 13, i.e. that is substantially parallel to the normal axis of the target surface 13. As utilized herein, the first optical axis 236BX being substantially normal to the target surface 13 is intended to include minor fluctuations of the image sensor assembly 233 and/or the target surface 13 about the X axis and/or about the Y axis when the stage 14A is being moved relative to the base 12. As described in greater detail herein below, by positioning the first lens assembly 236B in such a manner, the first images can be analyzed, e.g., by the control system 20A, to detect relative movement between the image sensor assembly 233 and the target surface 13 along the X axis and along the Y axis.

Further, in certain embodiments, the first lens assembly 236B can be a doubly telecentric lens assembly. In one embodiment, the lenses 236B1, 236B2 are separated by the sums of their focal lengths, and combine to create a doubly compound telecentric lens assembly which has its entrance and exit pupil at infinity. An entrance pupil at infinity makes the lens 236B1, 236B2 object-space telecentric. An exit pupil at infinity makes the lens 236B1, 236B2 image-space telecentric. If both pupils are at infinity, the first lens assembly 236B is doubly telecentric.

An image-space telecentric lens 236B1, 236B2 produces images of the same size regardless of the distance between the lens 236B1, 236B2 and the film or image sensor 236A. This allows the lens 236B1, 236B2 to be focused to different distances without changing the size of the image captured by the image sensor 236A, although of course the image will blur when it is not at best focus. Additionally, lens assemblies 236B that are doubly telecentric have magnification that is more precisely constant than those that are only object-side telecentric, because the principal ray intercept position on the image sensor does not change. Thus, such doubly telecentric lens assemblies provide an orthographic projection, providing the same magnification at all distances. An object (e.g., the target surface 13) that is too close or too far from the lens assembly, e.g., the first lens assembly 236B, may still be out of focus, but the resulting blurry image will be the same size as the correctly focused image would be. This property allows precise measurement of objects regardless of position. Conversely, non-telecentric lenses exhibit varying magnification for objects at different distances from the lens, which can adversely impact any positional measurement of the image sensor assembly 233 relative to the target surface 13.

It should be appreciated that the term "lens assembly" as utilized herein, such as with the first lens assembly 236B, can include any desired number of lenses. Additionally, it should also be appreciated that the use of the term "lens", such as with the first lens 236B1 and the second lens 236B2, is not intended to be restricted to just a single lens. For example, in some embodiments, each of the first lens 236B1 and the second lens 236B2 can be a cemented achromatic doublet which is comprised of two lenses of different types of glass. Thus, in such embodiments, each "lens" actually includes a pair of lenses, and the "lens assembly" includes a total of four individual lenses. Thus, the use of the specific terms "lens assembly" and "lens" is not intended to be limiting in any manner.

The design and positioning of the second image sensor combination 237 can be varied to suit the specific requirements of the image sensor assembly 233. For example, as shown in FIG. 2A, the second image sensor combination 237 can include a second image sensor 237A that is coupled to and/or retained within the assembly housing 233A, and a second lens assembly 237B that is positioned in the optical path between the second image sensor 237A and the target surface 13. With this design, the second image sensor 237A captures successive, two-dimensional, second images of the target surface 13 over time as the stage 14A and the image sensor assembly 233 are moved relative to the target surface 13.

Additionally, the design of the second image sensor 237A can be varied to suit the specific requirements of the second image sensor combination 237. For example, in some embodiments, the second image sensor 237A can be substantially identical in design as the first image sensor 236A. Alternatively, the second image sensor 237A can have a different design.

The second lens assembly 237B shapes and/or focuses the light between the target surface 13 and the second image sensor 237A. The design, positioning and orientation of the second lens assembly 237B can be varied depending on the requirements of the image sensor assembly 233. In the embodiment illustrated in FIG. 2A, the second lens assembly 237B includes a pair of spaced apart lenses, i.e. a third lens 237B1 and a fourth lens 237B2, that are spaced apart along the second optical axis 237BX, and that are positioned in the optical path between the target surface 13 and the second image sensor 237A.

Additionally, the second lens assembly 237B can have a second optical axis 237BX that is at a predetermined angle 237C relative to normal to the target surface 13. For example, as shown in FIG. 2A, the axis of the third lens 237B1 and the fourth lens 237B2 have been tilted and/or rotated about the Y axis, such that the second optical axis 237BX is at a predetermined angle 237C relative to normal to the target surface 13. Alternatively, the third lens 237B1 and the fourth lens 237B2 can be tilted and/or rotated about the X axis.

In certain embodiments, the angle 237C relative to normal for the second optical axis 237BX can be between thirty and sixty degrees. Alternatively, in other embodiments, the angle 237C relative to normal for the second optical axis 237BX can be between forty and fifty degrees. Still alternatively, in one non-exclusive embodiment, the angle 237C relative to normal for the second optical axis 237BX can be forty-five degrees.

As described in greater detail herein below, by positioning the second lens assembly 237B in such a manner, i.e. with the lenses 237B1, 237B2 tilted about the Y axis, the second image sensor combination 237 effectively couples together any relative movement between the image sensor assembly 233 and the target surface 13 along the X axis and along the Z axis. Alternatively, in embodiments where the lenses 237B1, 237B2 are tilted about the X axis, the second image sensor combination 237 effectively couples together any relative movement between the image sensor assembly 233 and the target surface 13 along the Y axis and along the Z axis.

Further, in certain embodiments, the second lens assembly 237B can also be a doubly telecentric lens assembly.

More particularly, in one non-exclusive embodiment, the image sensor assembly 233 utilizes two substantially identical doubly telecentric lens assemblies 236B, 237B, with one having an optical axis 236BX that is substantially perpendicular to the target surface 13, and the other having an optical axis 237BX that is at forty-five degrees relative to the normal axis of the target surface 13. The doubly telecentric lens combinations {236B1, 236B2} and {237B1, 237B2} correct any keystone distortion that may otherwise be done in software. Additionally, as provided herein, the forty-five degree incident angle configuration must satisfy the Scheimpflug condition in order to maintain focus across the entire image, and, as such, the image sensor, i.e. the second image sensor 237A, is tilted and/or rotated with respect to the second optical axis 237BX. For example, as shown in FIG. 2A, when the second optical axis 237BX is at an angle of forty-five degrees relative to the normal axis of the target surface 13, the second image sensor 237A can be tilted, e.g., also about the Y axis, by forty-five degrees relative to the second optical axis 237BX.

It should be appreciated that the terms "first" and "second" for the image sensor combinations 236, 237, the image sensors 236A, 237A and the lens assemblies 236B, 237B is merely for purposes of convenience and ease of description, and either of the image sensor combinations 236, 237, the image sensors 236A, 237A and the kens assemblies 236B, 237B can be referred to as "first" or "second".

Additionally, it should be appreciated that regardless of the number of image sensor combinations that may be utilized within the image sensor assembly 233, at least one of the image sensor combinations must include a lens assembly having an optical axis that is at an angle relative to the normal axis of the target surface 13. For example, in an embodiment of the image sensor assembly 233 that includes three (or more) image sensor combinations, one, two or all of the image sensor combinations can include a lens assembly having an optical axis that is at an angle relative to the normal axis of the target surface 13.

Further, it should be appreciated that the spacing between the lenses in each lens assembly, the spacing between the lenses and the corresponding image sensors, and the spacing between the lenses and the target surface are merely provided as shown in FIG. 2A for ease of illustration. More specifically, the actual spacing may vary from what is shown in FIG. 2A without deviating from the intended scope and breadth of the present invention.

Figure 2B:
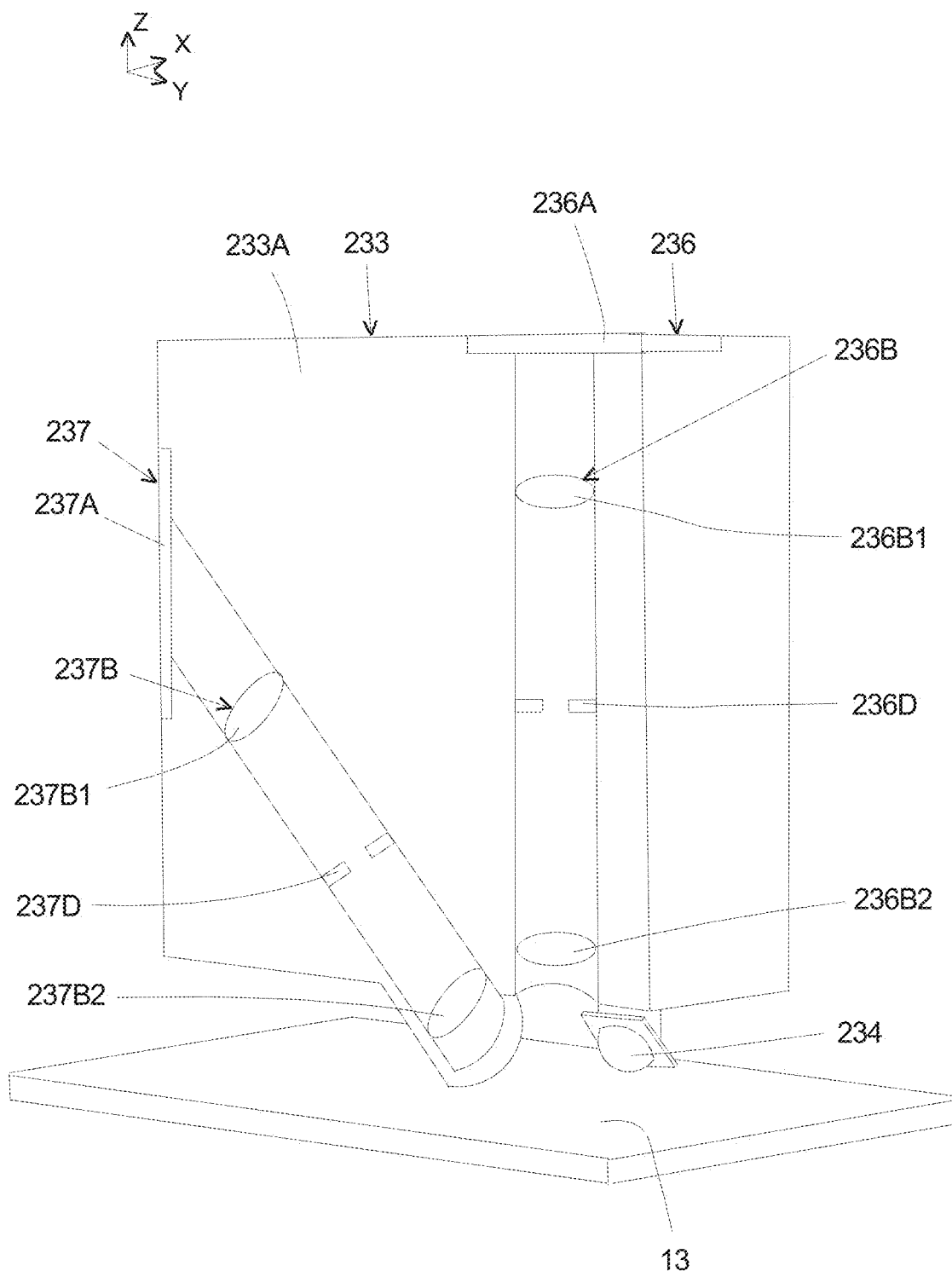
FIG. 2B is a simplified cutaway view of an embodiment of the image sensor assembly of FIG. 2A and a target.

In some applications, a simple way to make a lens telecentric is to put an aperture stop at a focal point of the lens. Accordingly, a simple way to make a lens assembly doubly telecentric can be to put an aperture stop that is collocated at the focal point of both lenses. Such an application can be seen in FIG. 2B. In particular, FIG. 2B is a simplified cutaway view of an embodiment of the image sensor assembly 233 (the measuring device) of FIG. 2A and a target surface 13. More specifically, FIG. 2B illustrates a specific implementation of the image sensor assembly 233 of FIG. 2A.

As shown, the image sensor assembly 233 as shown in FIG. 2B includes the assembly housing 233A, the light source 234, the first image sensor combination 236 having the first image sensor 236A and the first lens assembly 236B, and the second image sensor combination 237 having the second image sensor 237A and the second lens assembly 237B. However, in this embodiment, FIG. 2B further illustrates the first lens assembly 236B including a first aperture stop 236D that is collocated at the focal point of each of the first lens 236B1 and the second lens 236B2 of the first lens assembly 236B; and the second lens assembly 237B including a second aperture stop 237D that is collocated at the focal point of each of the third lens 237B1 and the fourth lens 237B2 of the second lens assembly 237B.

Figure 2C:
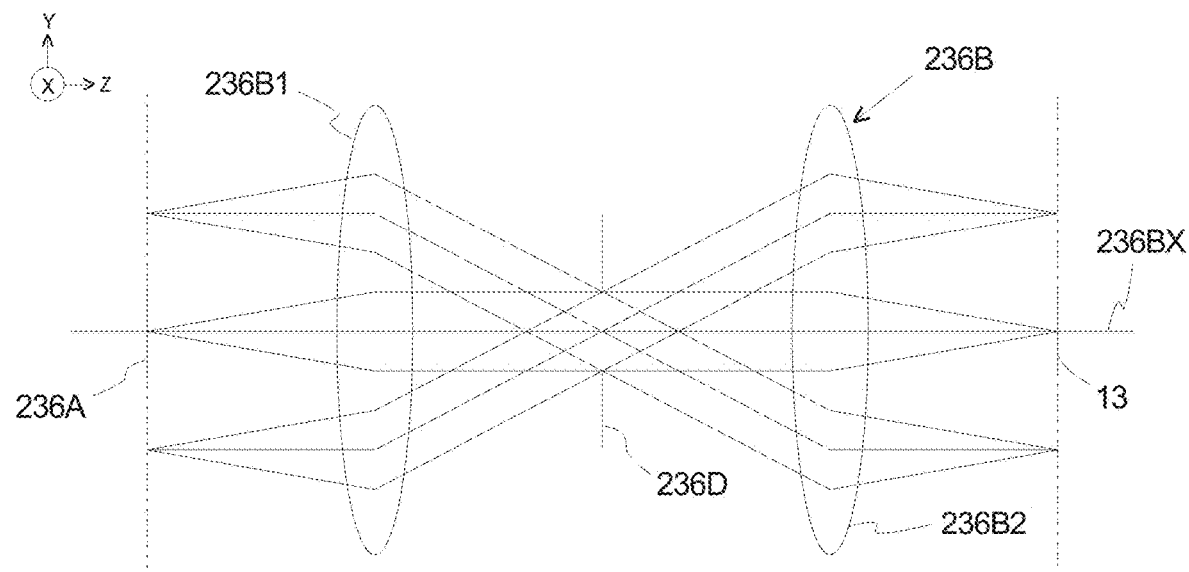
FIG. 2C is a simplified schematic illustration of a first lens assembly that can be utilized as part of the image sensor assembly of FIG. 2A.

FIG. 2C is a simplified schematic illustration of an embodiment of the first lens assembly 236B that can be utilized as part of the image sensor assembly 233 of FIG. 2A for sensing relative movement between the image sensor assembly 233 and the target surface 13 along the X axis and along the Y axis. In particular, FIG. 2C illustrates the first lens assembly 236B including the first lens 236B1 and the spaced apart, second lens 236B2 having the first optical axis 236BX that is substantially normal, i.e. perpendicular, to each of the plane of the target surface 13 and the plane of the image sensor 236A. Additionally, the first lens assembly 236B includes the first aperture stop 236D that is collocated at the focal length of both lenses 236B1, 236B2. Further, the plane of the image sensor 236A and the plane of the target surface 13 are parallel to one another and are also one focal length away from the nearest lens. Thus, the first lens assembly 236B produces a doubly telecentric configuration, with equal focal lengths and one-to-one magnification ($m=-1$).

Figure 2D:
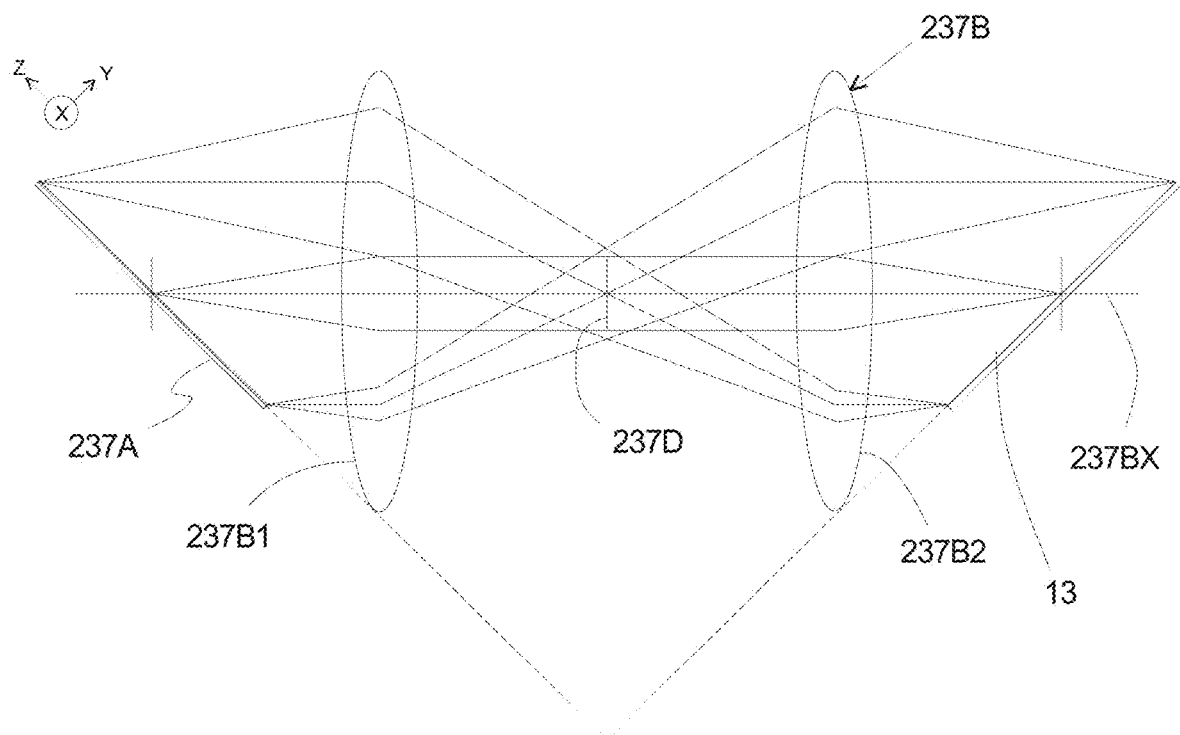
FIG. 2D is a simplified schematic illustration of a second lens assembly that can be utilized as part of the image sensor assembly of FIG. 2A.

FIG. 2D is a simplified schematic illustration of an embodiment of the second lens assembly 237B that can be utilized as part of the image sensor assembly 233 of FIG. 2A for sensing relative movement between the image sensor assembly 233 and the target surface 13, with relative movement along the X axis and along the Z axis being coupled together (or alternatively with relative movement along the Y axis and along the Z axis being coupled together). In particular, FIG. 2D illustrates the second lens assembly 237B including the third lens 237B1 and the spaced apart, fourth lens 237B2 having the second optical axis 237BX that is angled at forty-five degrees relative to normal for each of the plane of the target surface 13 and the plane of the image sensor 236A. Additionally, the second lens assembly 237B includes the second aperture stop 237D that is collocated at the focal length of both lenses 237B1, 237B2. Further, the plane of the image sensor 237A and the plane of the target surface 13 are also one focal length away from the nearest lens. Thus, the second lens assembly 237B produces a doubly telecentric configuration, with equal focal lengths and one-to-one magnification.

Additionally, as noted herein, the second lens assembly 237B is configured to satisfy the Scheimpflug condition in order to maintain focus across the entire image that is captured by the second image sensor 237A. In the Scheimpflug configuration, the center of the image window and the center of the subject's viewing window are at one focal length from the nearest lens. Further, to satisfy the Scheimpflug condition the image sensor 237A is tilted relative to the second optical axis, e.g., at forty-five degrees, so that the image is focused across the whole image sensor 237A. Even though the object (and its image) change distance to the lens along the length of the pattern viewing window, the constant magnification as a function of distance from the lens of the doubly-telecentric second lens assembly 237B inhibits keystone distortion from being introduced into the image.

In certain embodiments, the target surface 13 is relatively large and has a lot of irregularities that can be captured with images and analyzed to determine relative movement. Alternatively, the target surface 13 can be modified and/or designed to include one or more features (e.g., characters) that can be organized in a known pattern to speed up the analysis of the images, and increase the accuracy of the image sensor assembly 233.

Thus, as provided herein, for a three-dimensional sensor system, e.g. the first sensor system 26A (illustrated in FIG. 1A), that is based on pattern recognition, similar features are required as with previous two-dimensional sensor systems. For example, such a sensor system 26A includes the image sensor assembly 233, with its image sensors 236A, 237A, lenses 236B1, 236B2, 237B1, 237B2, illumination (i.e. light source 234), and electronics, as well as the target to be sensed, which includes a known surface pattern. The sensor system 26A detects the motion of the pattern and discerns the relative displacement of the image sensor 236A, 237A to the sensed pattern.

To produce good sensing, a good image of the surface pattern is captured by the image sensor 236A, 237A in a way that is robust to the motion of the image sensor 236A, 237A, specifically the distance from the pattern to the lens assembly 236B, 237B and its tilt. As provided herein, an effective way to achieve this is through the use of a doubly telecentric lens. Additionally, the present sensor system 26A also seeks to sense the Z-motion (where X and Y are in the plane of the pattern surface) which is achieved through the use of a tilted second lens assembly 237B. Again, an effective means to achieve this is through the use of a doubly-telecentric lens assembly 237B, where the position of the surface pattern and the image sensor 237A satisfy the Scheimpflug condition.

Further, it can be appreciated that various advantages of the image sensor assembly 233 are a direct result of the doubly telecentric design of the lens assemblies 236B, 237B. For example, with the doubly telecentric design, the magnification is constant for all distances from the lens assemblies 236B, 237B, which is true for both sides of the lens assembly 236B, 237B. Additionally, for the pattern being observed from the subject, if the distance from the lens assembly 236B, 237B changes, the image may go in and out of focus, but the position of the peaks and valleys of pixel intensity (see e.g., FIGS. 6A-6C and 7A-7C) relative to each other do not change in scale. Thus, a simple algorithm can be effectively developed due to the consistency of the surface pattern.

Figure 3A:
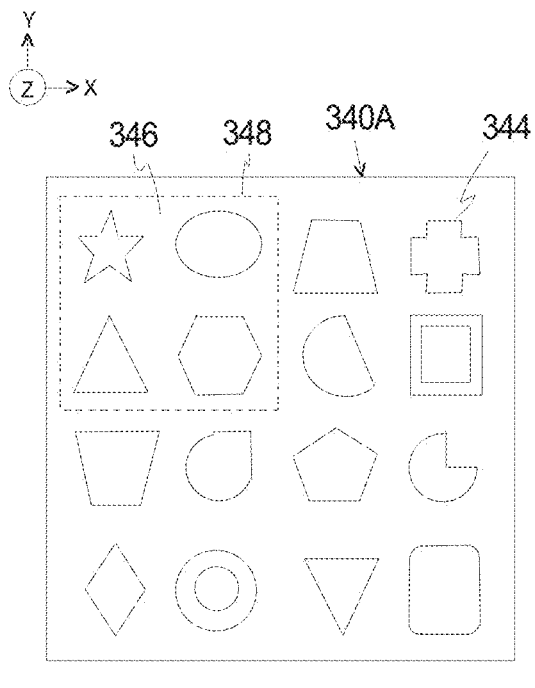
FIGS. 3A and 3B are simplified illustrations of alternative images captured with a first image sensor combination of the image sensor assembly such as illustrated in FIG. 2A.
Figure 3B:
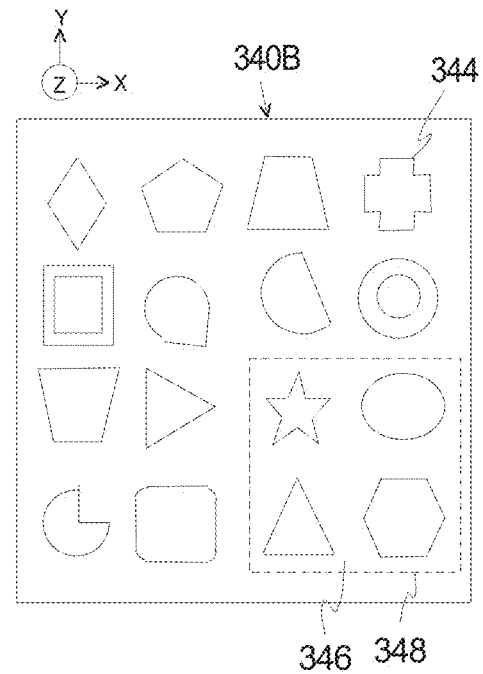

FIGS. 3A and 3B are simplified illustrations of alternative first images 340A, 340B of the target surface 13 (illustrated in FIG. 2A) captured at alternative times by the first image sensor combination 236 (illustrated in FIG. 2A) of the image sensor assembly 233 (illustrated in FIG. 2A). More particularly, FIG. 3A is a simplified illustration of a first, first image 340A captured with the first image sensor combination 236 at a first time (e.g., at a time of zero milliseconds (t=0 ms)), and FIG. 3B is a simplified illustration of a second, first image 340B captured with the first image sensor combination 236 at a second time (e.g., at a time that is 0.67 milliseconds later (t=0.67 ms)). These first images 340A, 340B illustrate the image of features 344 that can be provided on the target surface 13. During the time interval between the first time and the second time, the stage 14A (illustrated in FIG. 1A) and the first image sensor combination 236 have moved relative to the target surface 13. As a result thereof, the second, first image 340B can be similar to the first, first image 340A, but the features 344 in the second, first image 340B are shown as somewhat offset relative to the position of the features 344 in the first, first image 340A. Thus, the two first images 340A, 340B can be analyzed by the control system 20A (illustrated in FIG. 1A) and the relative displacement of the stage 14A along the X axis and along the Y axis can be determined. Stated in another fashion, the amount of movement between the stage 14A and the target surface 13 along the X axis during this time interval is equal to the amount of offset between the first images 340A, 340B along the X axis; and the amount of relative movement between the stage 14A and the target surface 13 along the Y axis during this time interval is equal to the amount of offset between the first images 340A, 340B along the Y axis.

The presence of the features 344 along the target surface 13 will allow the first image sensor combination 236 to periodically "reset" itself when it sees a pattern with a known location, and update the absolute location of the first image sensor combination 236.

The present invention can also utilize one or more additional methods for further improving the tracking speed and accuracy of the three-dimensional image sensor assembly 233. For example, the measurement rate for such a three-dimensional image sensor assembly 233 can be improved by using dead-reckoning information to predict the expected image or otherwise reduce the detection or computational requirements of the image acquisition or processing. For example, for a lithography system, the control system 20A (illustrated in FIG. 1A) knows and controls the stage mover assembly 16A (illustrated in FIG. 1A) to move the stage 14A along a desired trajectory for the stage 14A. Thus, when the image sensor assembly 233, i.e. the measuring device, is used with photolithography equipment, to a very large extent, the control system 20A knows where the stage 14A is going at all times. This means that the control system 20A will have a very good idea of which two sections of the subsequent images 340A, 340B will overlap.

Consider the first images 340A, 340B provided in FIGS. 3A and 3B. In this example, the overlapping area 346 is inside the dashed box 348 of FIGS. 3A and 3B. Because, the control system 20A knows the desired trajectory in certain embodiments, only dashed box 348 area of each of the images 340A, 340B needs to be stored and processed in order to determine the relative displacement. This can be done, because it is known ahead of time that this is the only information that is important. This reduces computational overhead very significantly and allows the present image sensor assembly 233 to work faster, while still being able to accurately track the movement of the stage 14A. However, if the trajectory is not known, the entirety of each image can still be stored and processed to determine the relative positioning (displacements) for each time step.

Figure 3C:
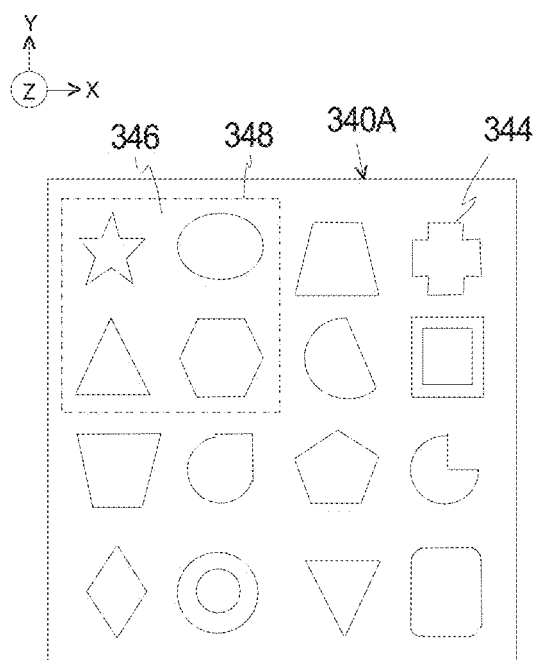
FIGS. 3C and 3D are simplified illustrations of alternative images captured with a second image sensor combination of the image sensor assembly such as illustrated in FIG. 2A.
Figure 3D:
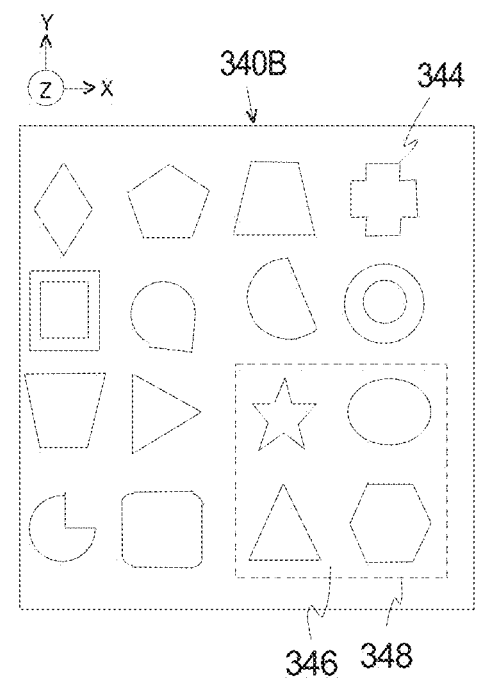

Somewhat similarly, FIGS. 3C and 3D are simplified illustrations of alternative second images 342A, 342B of the target surface 13 (illustrated in FIG. 2A) captured at alternative times by the second image sensor combination 237 (illustrated in FIG. 2A) of the image sensor assembly 233 (illustrated in FIG. 2A). More particularly, FIG. 3C is a simplified illustration of a first, second image 342A captured with the second image sensor combination 237 at the first time, and FIG. 3D is a simplified illustration of a second, second image 342B captured with the second image sensor combination 237 at the second time. These second images 342A, 342B again illustrate the image of features 344 that exist on the target surface 13.

As illustrated, the first, second image 342A captured by the second image sensor combination 237 at time zero, as shown in FIG. 3C, is substantially identical to the first, first image 340A captured by the first image sensor combination 236 at time zero, as shown in FIG. 3A. However, due to different orientation of the second lens assembly 237B (illustrated in FIG. 2A) of the second image sensor combination 237, the second, second image 342B captured by the second image sensor combination 237 at the second time is somewhat offset from the second, first image 340B captured by the first image sensor combination 236 at the second time.

More specifically, the relative movement of the overlapping area 346 of the pattern 344 inside the dashed box 348 from FIG. 3C to FIG. 3D along the Y axis is substantially identical to what was shown from FIG. 3A to FIG. 3B; but the relative movement of the overlapping area 346 of the pattern 344 inside the dashed box 348 from FIG. 3C to FIG. 3D along the X axis is somewhat offset as compared to what was shown from FIG. 3A to FIG. 3B. The offset of the overlapping area 346 along the X axis between FIG. 3B and FIG. 3D can be attributed to movement of the stage 14A (illustrated in FIG. 1A) relative to the target surface 13 along the Z axis. Stated in another manner, with the second image sensor combination 237, the relative movement along the X axis is coupled to the relative movement along the Z axis. Subsequently, by comparing the position of the overlapping area 346 of the pattern 344 along the X axis in FIGS. 3B and 3D, the control system 20A (illustrated in FIG. 1A) can extrapolate and thus determine the extent of the relative movement between the stage 14A and the target surface 13 along the Z axis. Thus, the motion in the X and Z directions that is coupled together within the second image sensor combination 237 can be effectively decoupled utilizing information from the first image sensor combination 236, such that the relative movement between the stage 14A and the target surface 13 along the Z axis can be effectively determined.

Figure 4A:
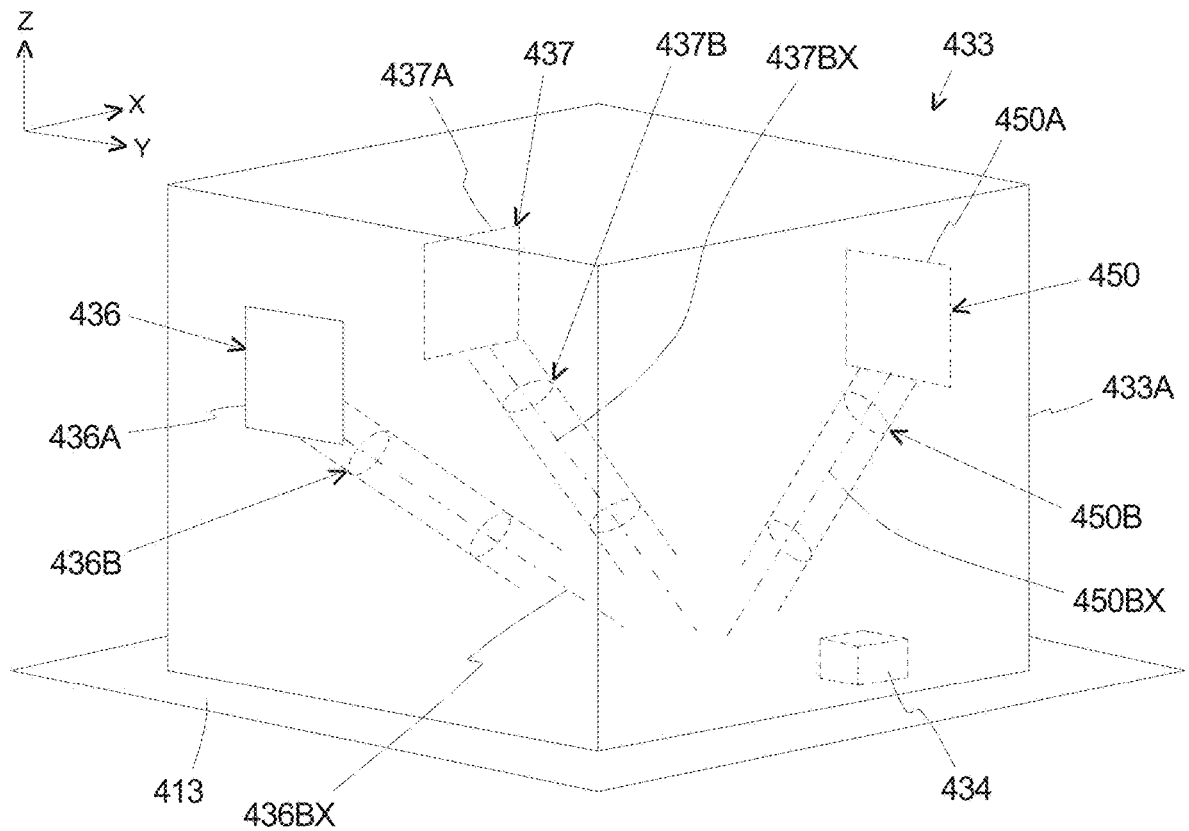
FIG. 4A is a simplified schematic perspective view illustration of another embodiment of an image sensor assembly having features of the present invention and a portion of a stage assembly and a target surface.

FIG. 4A is a simplified schematic perspective view illustration of another embodiment of an image sensor assembly 433, i.e. a measuring device, having features of the present invention and a target surface 413. In this embodiment, the image sensor assembly 433 includes an assembly housing 433A, and a light source 434 (illustrated as a box in phantom) that are substantially similar to the corresponding components illustrated and described in detail above.

However, in this embodiment, the image sensor assembly 433 includes a first image sensor combination 436 (i.e. including a first image sensor 436A and a first lens assembly 436B (illustrated in phantom)), a second image sensor combination 437 (i.e. including a second image sensor 437A (illustrated in phantom) and a second lens assembly 437B (illustrated in phantom)), and a third image sensor combination 450 (i.e. including a third image sensor 450A (illustrated in phantom) and a third lens assembly 450B (illustrated in phantom)). As illustrated in this embodiment, each of the lens assemblies 436B, 437B, 450B is tilted relative to the normal axis of the target surface 413. More specifically, (i) the first lens assembly 436B is tilted relative to the normal axis of the target surface 413 such that a first optical axis 436BX of the first lens assembly 436B is at an angle relative to the normal axis of the target surface 413; (ii) the second lens assembly 437B is tilted relative to the normal axis of the target surface 413 such that a second optical axis 437BX of the second lens assembly 437B is at an angle relative to the normal axis of the target surface 413; and (iii) the third lens assembly 450B is tilted relative to the normal axis of the target surface 413 such that a third optical axis 450BX of the third lens assembly 450B is at an angle relative to the normal axis of the target surface 413. In certain embodiments, each of the optical axes 436BX, 437BX, 450BX can be at an angle of between thirty and sixty degrees relative to the normal axis of the target surface 413. Alternatively, in some embodiments, each of the optical axes 436BX, 437BX, 450BX can be at an angle of between forty and fifty degrees relative to the normal axis of the target surface 413. Still alternatively, in one embodiment, each of the optical axes 436BX, 437BX, 450BX can be at an angle of forty-five degrees relative to the normal axis of the target surface 413. Yet alternatively, each of the optical axes 436BX, 437BX, 450BX can be at a different angle relative to the normal axis of the target surface 413.

It should be appreciated that each of the lens assemblies 436B, 437B, 450B need not be tilted by the same amount relative to the normal axis of the target surface, i.e. the angle of each of the optical axes 436BX, 437BX, 450BX relative to the normal axis of the target surface 413 need not be the same. Additionally, it should also be appreciated that in such an embodiment that includes three (or more) image sensor combinations, one or more of the image sensor combinations can have a lens assembly with an optical axis that is normal, i.e. perpendicular to the target surface 413. As noted above, the image sensor assembly 433 can effectively sense the movement and/or position of the image sensor assembly 433 relative to the target surface 413 so long as at least one of the lens assemblies is tilted relative to the normal axis of the target surface 413.

Additionally, in some embodiments, each of the lens assemblies 436B, 437B, 450B can be positioned so as to observe a different portion of the target surface 413.

With the design illustrated in FIG. 4A, the image sensor assembly 433, i.e. each of the image sensor combinations 436, 437, 450, can capture successive images (first images, second images and third images, respectively) of the target surface 413. Subsequently, the control system 20A (illustrated in FIG. 2A) can analyze the captured images from each of the image sensor combinations 436, 437, 450. More specifically, the control system 20A can effectively combine the signals generated from each of the image sensors 436A, 437A, 450A via a specific algorithm to monitor the movement and/or position of the image sensor assembly 433 relative to the target surface 413 along the X, Y and Z axes, and about the X, Y and Z axes (six degrees of freedom).

For example, each image sensor 436A, 437A, 450A can measure movement in the X and Y directions as a function of several variables. In particular:

$$\Delta X_{measured} = (\Delta X_{actual}/\cos\Theta_z) + (\Delta Z\tan\Theta_y/\cos\Theta_z) + (Z\tan\Delta\Theta_y/\cos\Theta_z) + \Delta Y_{measured}\sin\Theta_z \quad \text{(Equation 1)}$$

$$\Delta Y_{measured} = (\Delta Y_{actual}/\cos\Theta_z) + (\Delta Z\tan\Theta_x/\cos\Theta_z) + (Z\tan\Delta\Theta_x/\cos\Theta_z) + \Delta X_{measured}\sin\Theta_z \quad \text{(Equation 2)}$$

Thus, from the three image sensors 436A, 437A, 450A, six equations can be derived, with a total of twelve variables. The remaining six equations can be derived from the three rotations about the X, Y and Z axes. Subsequently, once this system of equations is solved, the control system 20A can calculate the position of a center 451 (illustrated in FIG. 4B)

of the image sensor assembly 433 along the X, Y and Z axes, and about the X, Y and Z axes.

Figure 4B:
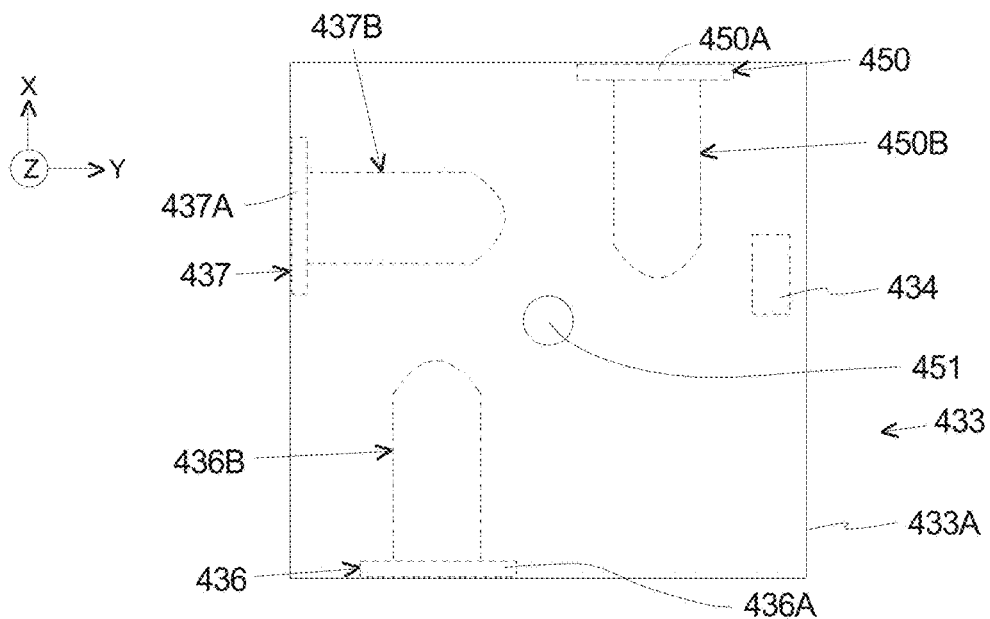
FIG. 4B is a simplified schematic top view illustration of the image sensor assembly of FIG. 4A.

FIG. 4B is a simplified schematic top view illustration of the image sensor assembly 433 of FIG. 4A. In particular, FIG. 4B illustrates the assembly housing 433A, the light source 434 (illustrated in phantom), the first image sensor combination 436 (illustrated in phantom) including the first image sensor 436A (illustrated in phantom) and the first lens assembly 436B (illustrated in phantom), the second image sensor combination 437 (illustrated in phantom) including the second image sensor 437A (illustrated in phantom) and the second lens assembly 437B (illustrated in phantom), and the third image sensor combination 450 (illustrated in phantom) including the third image sensor 450A (illustrated in phantom) and the third lens assembly 450B (illustrated in phantom).

Figure 5:
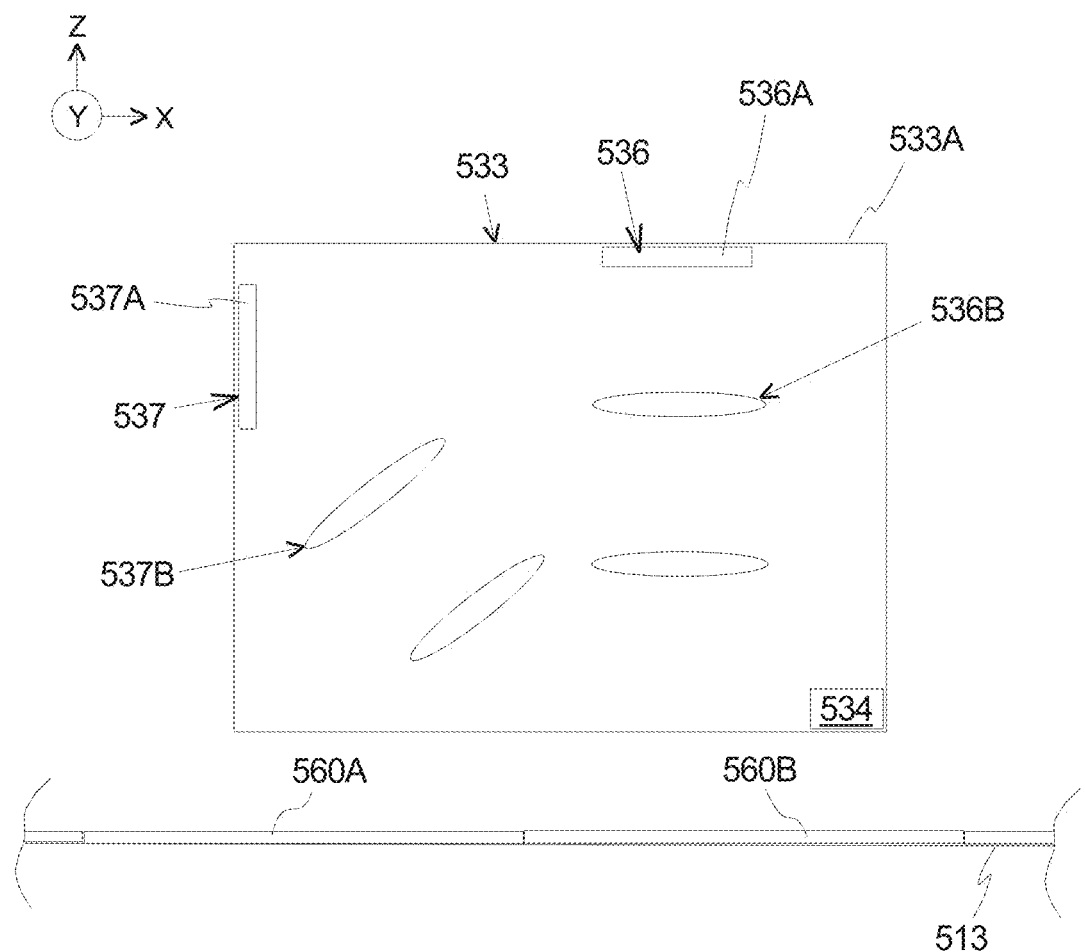
FIG. 5 is a simplified schematic side view illustration of still another embodiment of an image sensor assembly having features of the present invention and a portion of a stage assembly.

FIG. 5 is a simplified schematic side view illustration of still another embodiment of an image sensor assembly 533, i.e. a measuring device, having features of the present invention and a target surface 513. As shown, the image sensor assembly 533 can be substantially similar to the image sensor assembly 233 illustrated and described above in relation to FIG. 2A. More specifically, as illustrated in FIG. 5, in one embodiment, the image sensor assembly 533 can include an assembly housing 533A, a light source 534 (illustrated as a box), a first image sensor combination 536 (i.e. including a first image sensor 536A and a first lens assembly 536B) and a second image sensor combination 537 (i.e. including a second image sensor 537A and a second lens assembly 537B) that are substantially similar to such components illustrated and described above.

Additionally, as illustrated, one or more patterns, e.g., a first pattern 560A and a second pattern 560B, can be secured to, formed onto and/or formed into the target surface 513. In certain alternative embodiments, the one or more patterns 560A, 560B can be deliberately provided on the target surface 513 and/or the one or more patterns 560A, 560B can comprise random surface variations, so long as the one or more patterns 560A, 560B are known prior to use of the image sensor assembly 533. The first image sensor combination 536 and the second image sensor combination 537 can be utilized to capture images of the one or more patterns 560A, 560B that are secured to, formed onto and/or formed into the target surface 513. As noted herein, the control system 20A (illustrated in FIG. 2A) analyzes successive images captured with the image sensor combinations 536, 537, so as to accurately detect relative and/or absolute movement between the image sensor assembly 533 attached to the stage 14A (illustrated in FIG. 1A) and the target surface 513.

Further, as described in greater detail herein below, by capturing images that include all or portions of each of the one or more patterns 560A, 560B, which can be arranged in a specific known manner along the target surface 513, the control system 20A is able to effectively identify the absolute position of the image sensor assembly 533 and thus the stage 14A relative to the target surface 513. This can be accomplished as the image sensor assembly 533 is able to identify a "home position" by effectively distinguishing between the one or more patterns that are present along the target surface 513. Additionally, this design also minimizes the amount of overlap that is needed between successive images for proper functionality, thereby further enabling an increased tracking speed.

Figure 6A:
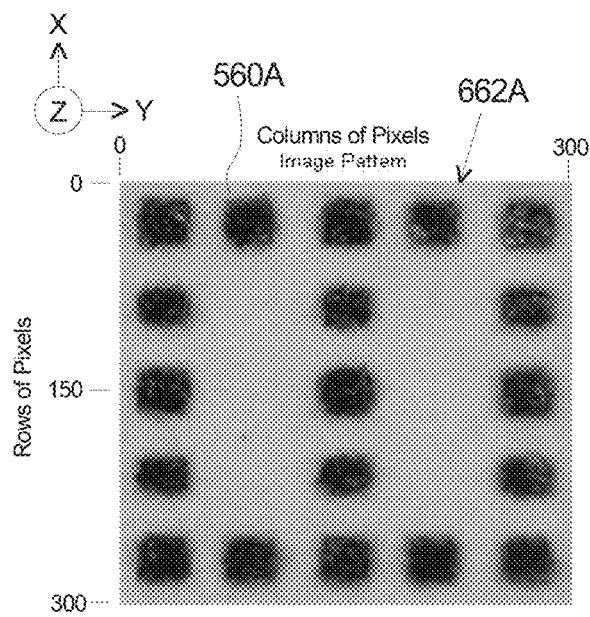
FIG. 6A illustrates a first image of a first pattern captured with the image sensor assembly illustrated in FIG. 5.

FIG. 6A illustrates a non-exclusive example of a first image 662A that comprises an image of a first pattern 560A that has been captured with the image sensor assembly 533 illustrated in FIG. 5. As shown in FIG. 6A, the first image 662A includes three hundred (300) rows of pixels that extend in the Y direction and three hundred (300) columns of pixels that extend in the X direction. Thus, the first image 662A includes ninety thousand pixels that are arranged in a 300 by 300 array. Alternatively, the first image 662A can include greater than or less than three hundred rows of pixels, greater than or less than three hundred columns of pixels, and/or greater than or less than ninety thousand total pixels that can be arranged in a different manner.

The first pattern 560A can be specifically designed to enhance the performance of the image sensor assembly 533. For example, as illustrated in FIG. 6A, highly contrasting regions within the first pattern 560A provide excellent features for tracking and counting. By keeping track of how many peaks and valleys have crossed an arbitrary constant point on the image sensor 536A, errors can be eliminated that may otherwise exist in a more conventional system. In FIG. 6A, the first pattern 560A includes a plurality of darkened squares that are positioned in a particular pattern along a lighter colored background. The first pattern 560A can be varied as desired, so long as sufficiently highly contrasting regions exist within the patterns to enable easy and effective tracking and counting.

Additionally, processing time can be further reduced by decoupling the axes, allowing the processing algorithms to individually work in parallel on each of the axes, e.g., individually on each of the X axis and the Y axis.

Figure 6B:
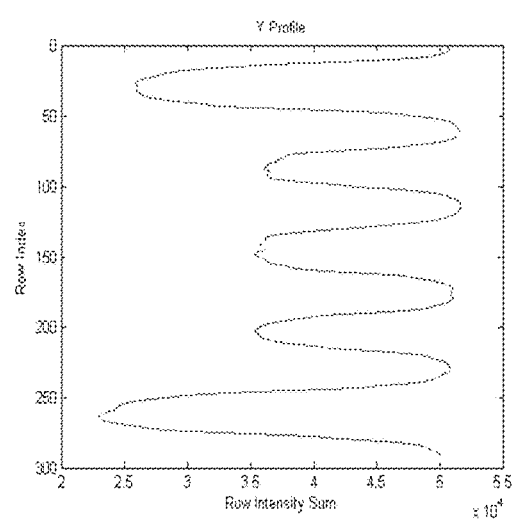
FIG. 6B is a graphical illustration of a measurement of the light intensity summed along a first axis in the first image of FIG. 6A.

FIG. 6B is a graphical illustration of a measurement of the light intensity summed along a first axis in the first image 662A of FIG. 6A. More particularly, FIG. 6B illustrates the light intensity sum for each row of pixels that extends from one side of the first image 662A to the other side of the first image 662A in the Y direction. As utilized herein, the light intensity sum for one or more of the rows of pixels can be referred to generally as a "light intensity signal".

As can be seen in FIG. 6B, in rows of pixels that do not include any portion of the darkened squares, the summed intensity of light is at or near a peak value. Conversely, in rows of pixels that do include any such darkened squares, the summed intensity of light is evidenced by the valleys illustrated in FIG. 6B, with the depth of the valley corresponding with the number of darkened squares within the row.

As shown in FIG. 6B, each of the peaks and valleys of the summed intensity of light has a somewhat rounded (i.e. non-squared) profile. This provides evidence that the darkened squares are not precisely consistent in light intensity as captured in the first image 662A.

Figure 6C:
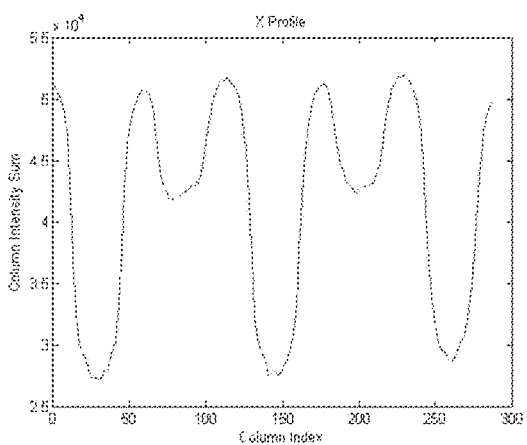
FIG. 6C is a graphical illustration of a measurement of the light intensity summed along a second axis in the first image of FIG. 6A.

FIG. 6C is a graphical illustration of a measurement of the light intensity summed along a second axis in the first image 662A of FIG. 6A. More particularly, FIG. 6C illustrates the light intensity sum for each column of pixels that extends from one side of the first image 662A to the other side of the first image 662A in the X direction. As utilized herein, the light intensity sum for one or more of the columns of pixels can be referred to generally as a "light intensity signal".

As can be seen in FIG. 6C, in columns of pixels that do not include any portion of the darkened squares, the summed intensity of light is at or near a peak value. Conversely, in columns of pixels that do include any such darkened squares, the summed intensity of light is evidenced by the valleys illustrated in FIG. 6C, with the depth of the valley corresponding with the number of darkened squares within the row. As further shown in FIG. 6C, each of the peaks and valleys of the summed intensity of light has a somewhat rounded (i.e. non-squared) profile for similar reasons as described above.

Figure 7A:
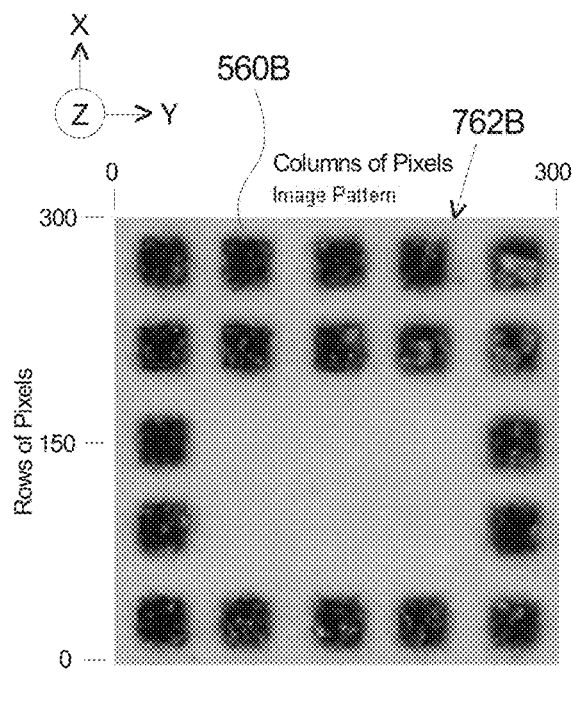
FIG. 7A illustrates a second image of a second pattern captured with the image sensor assembly illustrated in FIG. 5.

FIG. 7A illustrates a non-exclusive example of a second image 762B that comprises an image of the second pattern 560B that has been captured with the image sensor assembly 533 illustrated in FIG. 5. As shown in FIG. 7A, the second image 762B also includes three hundred (300) rows of pixels that extend in the Y direction and three hundred (300) columns of pixels that extend in the X direction, with ninety thousand total pixels, although different numbers can be used.

As illustrated in FIG. 7A, the second pattern 560B is slightly different than the first pattern 560A illustrated in FIG. 6A. By making this slight adjustment to the pattern, the second pattern 560B is again able to provide a unique readout that is easily detectable and distinguishable from the first pattern 560A and/or from any other patterns that may be utilized within the image sensor assembly 533. As illustrated in FIG. 7A, the second pattern 560B also includes highly contrasting regions that provide excellent features for tracking and counting. More particularly, in FIG. 7A, the second pattern 560B also includes a plurality of darkened squares that are positioned in a particular pattern along a lighter colored background, albeit in a slightly different pattern than is being utilized in the first pattern 560A. Additionally, by keeping track of how many peaks and valleys have crossed an arbitrary constant point on the image sensor 536A (illustrated in FIG. 5), errors can be eliminated that may otherwise exist in a more conventional system.

Figure 7B:
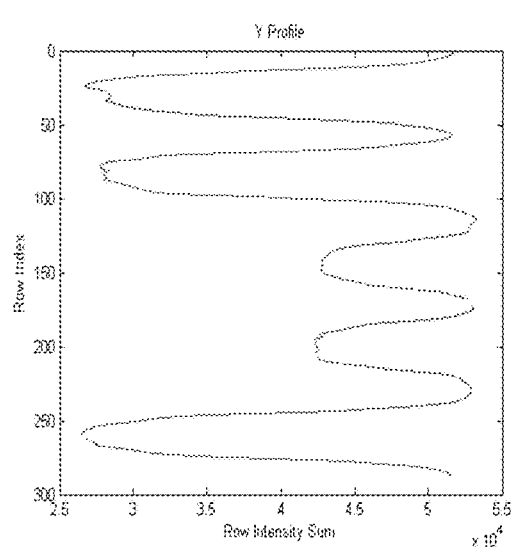
FIG. 7B is a graphical illustration of a measurement of the light intensity summed along a first axis in the first image of FIG. 7A.

FIG. 7B is a graphical illustration of a measurement of the light intensity summed along a first axis in the second image 762B of FIG. 7A. More particularly, FIG. 7B illustrates the light intensity sum for each row of pixels that extends from one side of the second image 762B to the other side of the second image 762B in the Y direction.

Figure 7C:
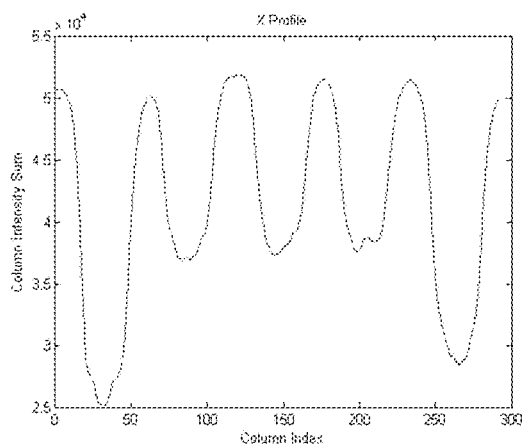
FIG. 7C is a graphical illustration of a measurement of the light intensity summed along a second axis in the first image of FIG. 7A.

FIG. 7C is a graphical illustration of a measurement of the light intensity summed along a second axis in the second image 762B of FIG. 7A. More particularly, FIG. 7C illustrates the light intensity sum for each column of pixels that extends from one side of the second image 762B to the other side of the second image 762B in the X direction.

Figure 8A:
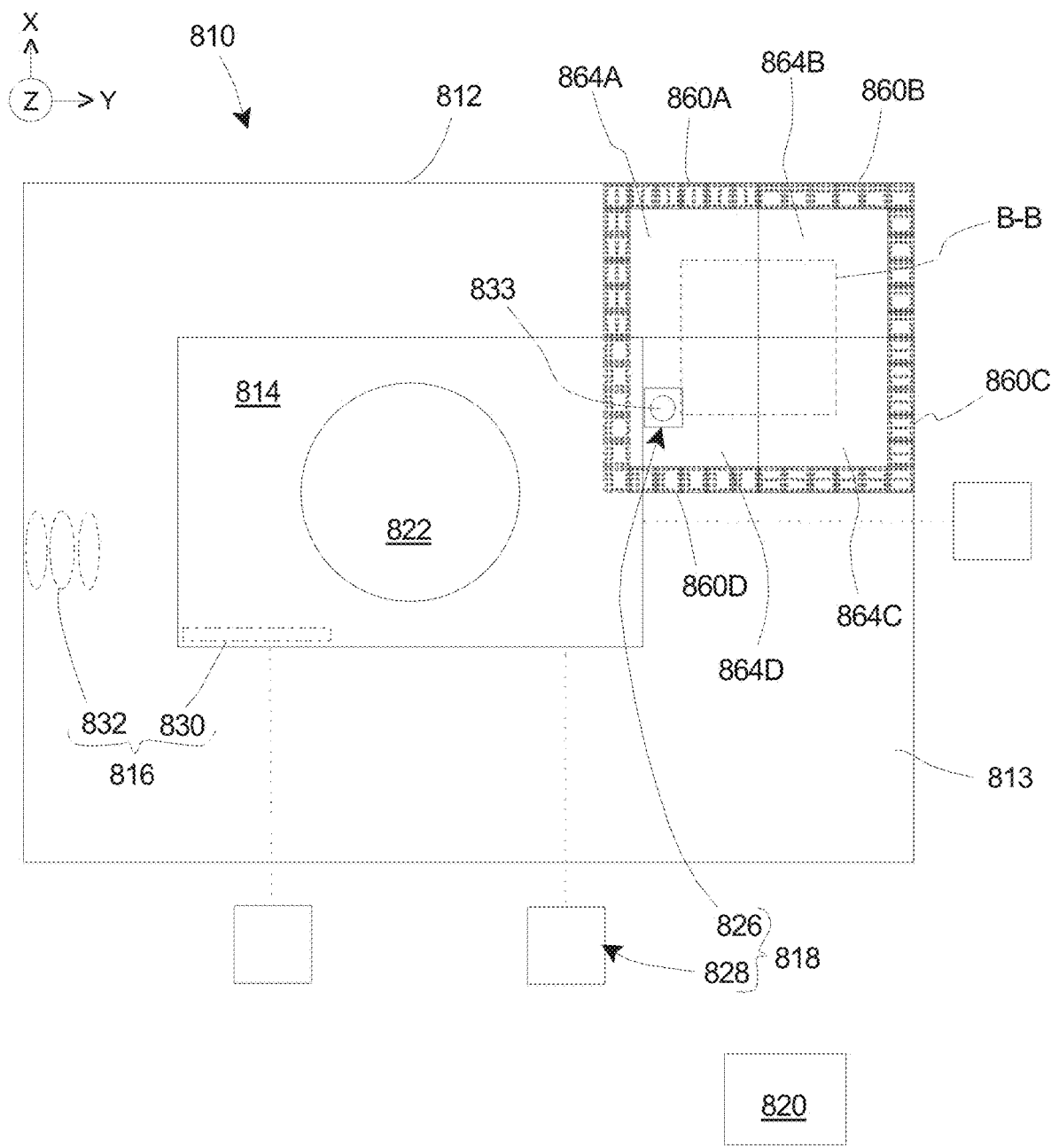
FIG. 8A is a simplified top view of still another embodiment of a stage assembly having features of the present invention.

FIG. 8A is a simplified top view of still another embodiment of a stage assembly 810 having features of the present invention. As illustrated, the stage assembly 810 is somewhat similar to the stage assembly 10A illustrated and described above in relation to FIG. 1A. For example, the stage assembly 810 can include a base 812 having a generally upward facing target surface 813, a stage 814 that retains a device 822, a stage mover assembly 816 including a magnet assembly 830 (only a portion is illustrated in phantom in FIG. 8A) and a conductor assembly 832 (only a portion is illustrated in phantom in FIG. 8A), and a control system 820 (illustrated as a box) that are similar to the corresponding components described above in reference to FIG. 1A. Additionally, the stage assembly 810 again includes a measurement system 818 having a first sensor system 826 and a second sensor system 828 that can monitor the movement and/or position of the stage 814 along the X, Y, and Z axes, and about the X, Y, and Z axes (six degrees of freedom).

However, in this embodiment, the first sensor system 826 is slightly different than in the previous embodiments. More specifically, as described in greater detail herein above, in this embodiment, the first sensor system 826 includes one or more image sensor assemblies 833 (only one is illustrated in FIG. 8A), with each image sensor assembly 833 (or measuring device) including an image profile sensor 536A (illustrated in FIG. 5) that is adapted to quickly and easily detect one or more patterns, e.g., a first pattern 860A, a second pattern 860B, a third pattern 860C and a fourth pattern 860D, that are secured to, formed onto and/or formed into the target surface 813 of the base 812. Only a portion of each pattern 860A-860D is illustrated in FIG. 8A for purposes of clarity. It should be appreciated that in other embodiments the number of different patterns that are secured to, formed onto and/or formed into the target surface 813 of the base 812 can be varied.

In such embodiment, the image profile sensor 536A is able to rapidly sum the intensity of light that is present in individual rows of pixels in the various patterns 860A-860D along a first axis, i.e. a Y axis, and in individual columns of pixels in the various patterns 860A-860D along a second axis, i.e. an X axis.

As further illustrated in FIG. 8A, like patterns 860A-860D can be grouped together along at least a portion of the target surface 813 to form four quadrants, which can be utilized to identify a home position 866 (illustrated in FIG. 8B) for purposes of enabling absolute measurement of the position of the stage 814. Stated in another manner, a first quadrant 864A can include a plurality of first patterns 860A, a second quadrant 864B can include a plurality of second patterns 860B, a third quadrant 864C can include a plurality of third patterns 860C, and a fourth quadrant 864D can include a plurality of fourth patterns 860D.

Figure 8B:
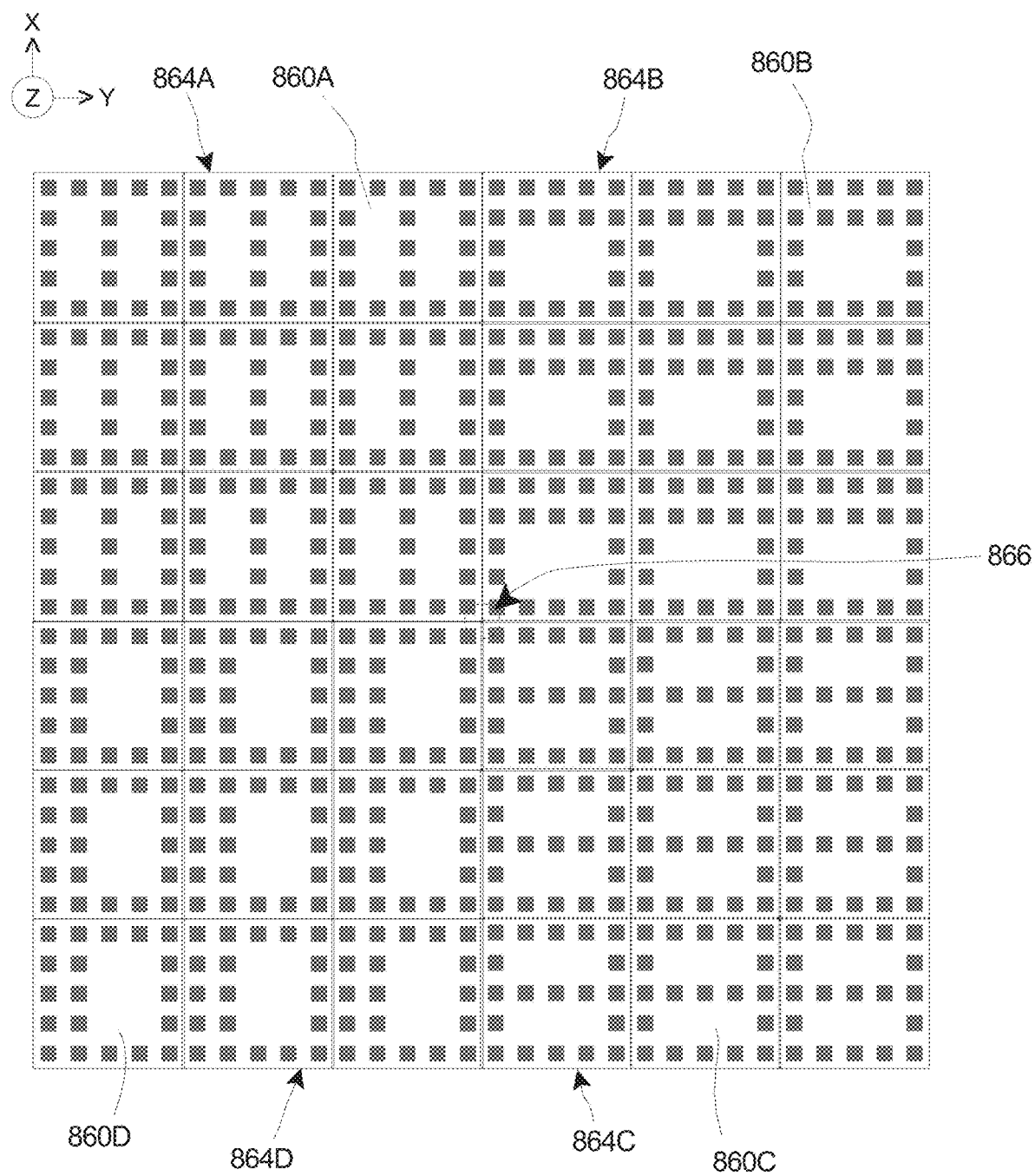
FIG. 8B is an enlarged view of a portion of the stage assembly illustrated in dashed box B-B in FIG. 8A.

FIG. 8B is an enlarged view of a portion of the stage assembly 810 illustrated in dashed box B-B in FIG. 8A. In particular, FIG. 8B illustrates each of the first pattern 860A, the second pattern 860B, the third pattern 860C and the fourth pattern 860D are secured to, formed onto and/or formed into the target surface 813 (illustrated in FIG. 8A) to be detected by the image sensor assembly 833 (illustrated in FIG. 8A). Additionally, as illustrated, like patterns 860A-860D can be grouped together to form the four quadrants 864A-864D, respectively, as noted above.

Moreover, as illustrated, the meeting point between each of the four quadrants 864A-864D can be utilized to define a home position 866 (illustrated by a dashed circle), which can be utilized to enable absolute measurement (as opposed to merely relative measurement) for the position of the stage 814 and the image sensor assembly 833 that is capturing an image of the home position 866. More specifically, as the image sensor assembly 833 captures images of one or more of the patterns 860A-860D, and by knowing the location of each of the patterns 860A-860D along the target surface 813, the image sensor assembly 833 is able to specifically identify which quadrant(s) 864A-864D the image sensor assembly 833 is adjacent to along the target surface 813. By identifying such quadrants 864A-864D, the control system 820 (illustrated in FIG. 8A) can control the stage mover assembly 816 (illustrated in FIG. 8A) to move in a certain direction, i.e. toward the quadrant(s) that are not identified in the captured images. Such process can be continued until each of the four quadrants 864A-864D, i.e. each of the four patterns 860A-860D, are identified in the captured image, at which point the home position 866 can be identified to enable such absolute measurement of the position of the stage 814.

Figure 9:
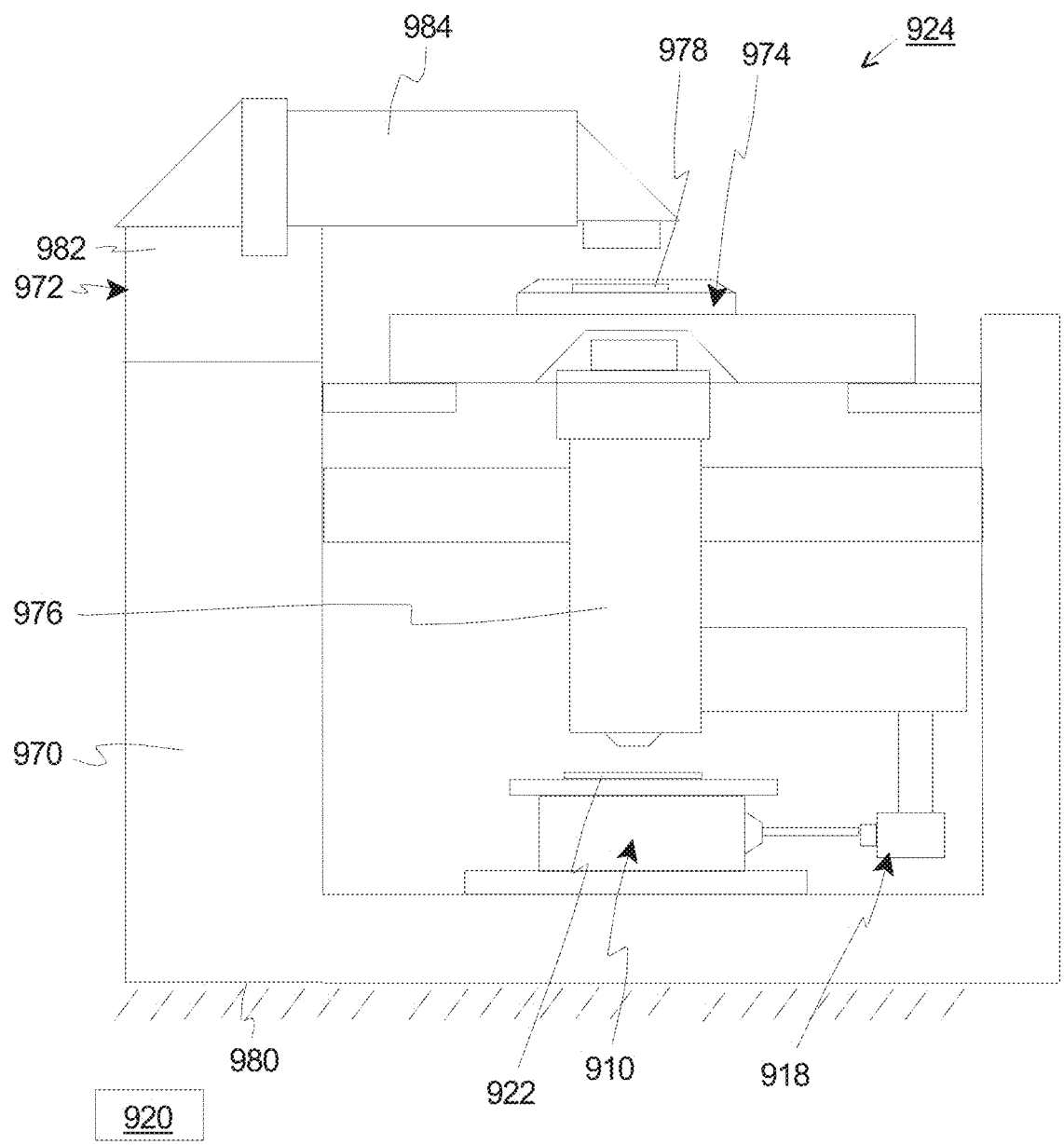
FIG. 9 is a schematic illustration of an exposure apparatus having features of the present invention.

FIG. 9 is a schematic view illustrating an exposure apparatus 924 useful with the present invention. The exposure apparatus 924 includes an apparatus frame 970, a measurement system 918 (only a portion is illustrated in FIG. 9), an illumination system 972 (irradiation apparatus), a reticle stage assembly 974, an optical assembly 976 (lens assembly), a wafer stage assembly 910, and a control system 920 that controls the reticle stage assembly 974 and the wafer stage assembly 910. The stage assemblies provided herein above can be used as the wafer stage assembly 910. Alternatively, with the disclosure provided herein, the stage assemblies provided herein above can be modified for use as the reticle stage assembly 974.

The exposure apparatus 924 is particularly useful as a lithographic device that transfers a pattern (not shown) of an integrated circuit from a reticle 978 onto a semiconductor wafer 922. The exposure apparatus 924 mounts to a mounting base 980, e.g., the ground, a base, or floor or some other supporting structure.

The apparatus frame 970 is rigid and supports the components of the exposure apparatus 924. The design of the apparatus frame 970 can be varied to suit the design requirements for the rest of the exposure apparatus 924.

The illumination system 972 includes an illumination source 982 and an illumination optical assembly 984. The illumination source 982 emits a beam (irradiation) of light energy. The illumination optical assembly 984 guides the beam of light energy from the illumination source 982 to the reticle 978. The beam illuminates selectively different portions of the reticle 978 and exposes the semiconductor wafer 922.

The optical assembly 976 projects and/or focuses the light passing through the reticle 978 to the wafer 922. Depending upon the design of the exposure apparatus 924, the optical assembly 976 can magnify or reduce the image illuminated on the reticle 978.

The reticle stage assembly 974 holds and positions the reticle 978 relative to the optical assembly 976 and the wafer 922. Similarly, the wafer stage assembly 910 holds and positions the wafer 922 with respect to the projected image of the illuminated portions of the reticle 978.

There are a number of different types of lithographic devices. For example, the exposure apparatus 924 can be used as a scanning type photolithography system that exposes the pattern from the reticle 978 onto the wafer 922 with the reticle 978 and the wafer 922 moving synchronously. Alternatively, the exposure apparatus 924 can be a step-and-repeat type photolithography system that exposes the reticle 978 while the reticle 978 and the wafer 922 are stationary.

However, the use of the exposure apparatus 924 and the stage assemblies provided herein are not limited to a photolithography system for semiconductor manufacturing. The exposure apparatus 924, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

It should be noted that the design of the measurement system can be varied pursuant to the teachings provided herein. For example, the image sensor assemblies could be positioned in such a way as to measure X or Y axes movement, while other sensors are used to measure Z axis movement.

Additionally, the same principle of locating the stage with respect to a stage base, countermass, or with respect to a reference frame using image sensor assemblies can be implemented on a moving coil stage as well (in the above embodiments, only a moving magnet stage is illustrated in the Figures).

A photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 10A:
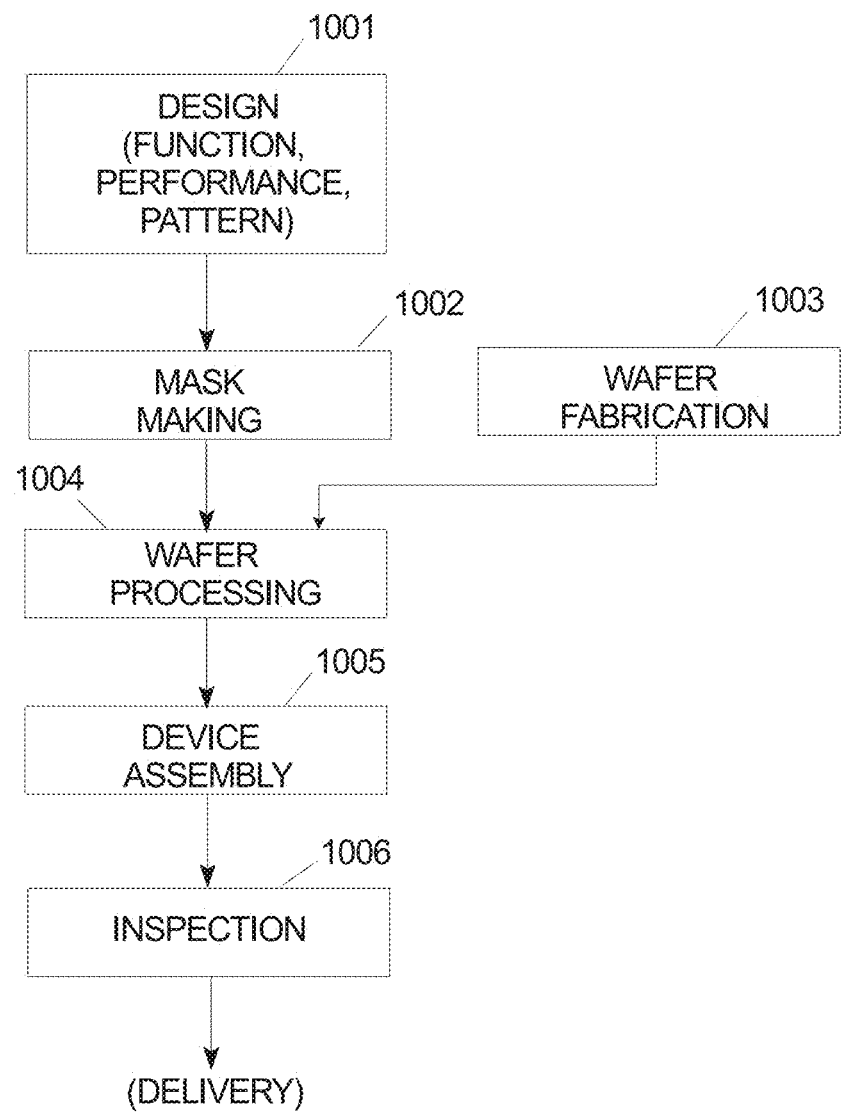
FIG. 10A is a flow chart that outlines a process for manufacturing a device in accordance with the present invention.

Further, semiconductor devices can be fabricated using the above described systems, by the process shown generally in FIG. 10A. In step 1001 the device's function and performance characteristics are designed. Next, in step 1002, a mask (reticle) having a pattern is designed according to the previous designing step, and in a parallel step 1003 a wafer is made from a silicon material. The mask pattern designed in step 1002 is exposed onto the wafer from step 1003 in step 1004 by a photolithography system described hereinabove in accordance with the present invention. In step 1005 the semiconductor device is assembled (including the dicing process, bonding process and packaging process), finally, the device is then inspected in step 1006.

Figure 10B:
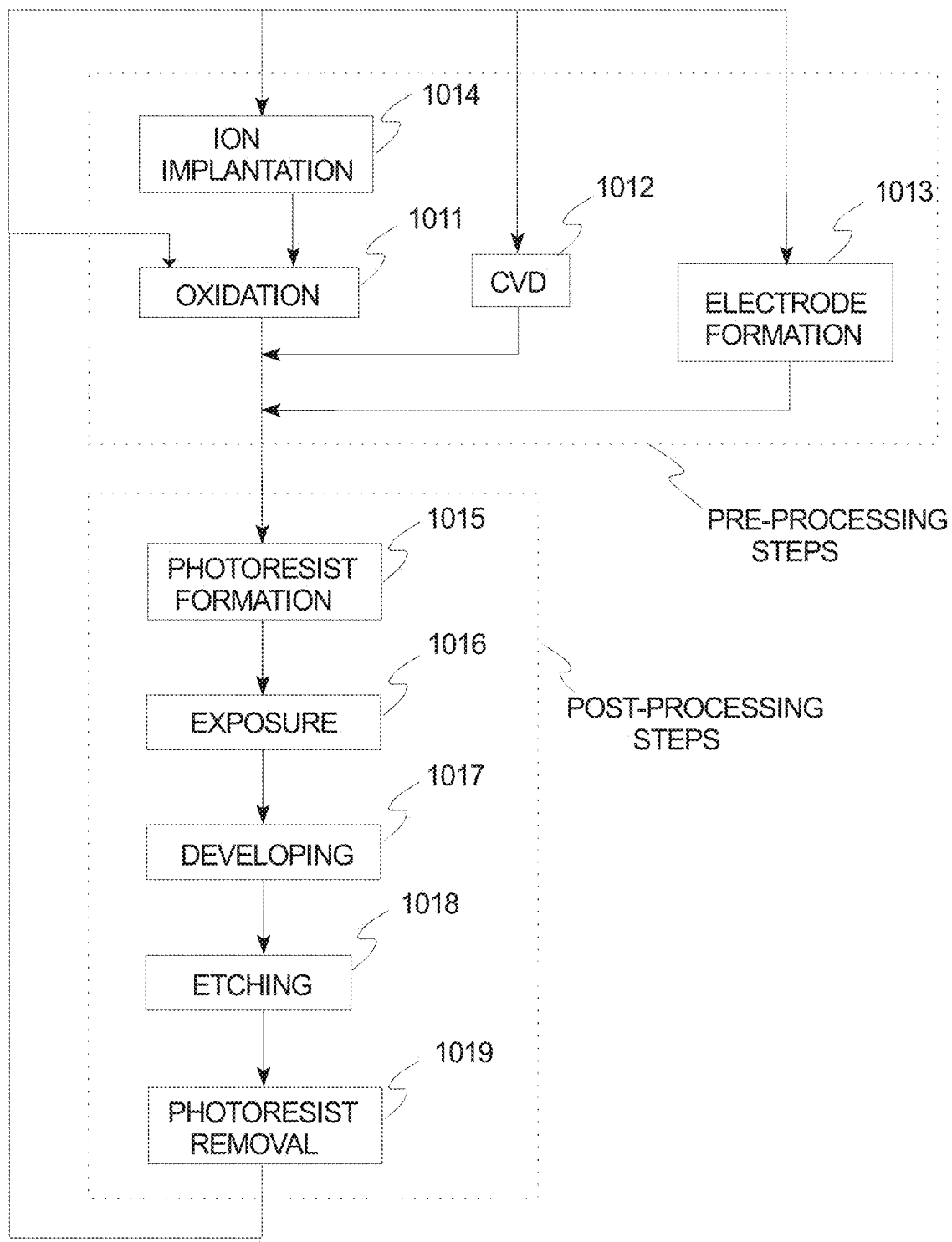
FIG. 10B is a flow chart that outlines device processing in more detail.

FIG. 10B illustrates a detailed flowchart example of the above-mentioned step 1004 in the case of fabricating semiconductor devices. In FIG. 10B, in step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above mentioned steps 1011-1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1015 (photoresist formation step), photoresist is applied to a wafer. Next, in step 1016 (exposure step), the above-mentioned exposure device is used to transfer the circuit pattern of a mask (reticle) to a wafer. Then in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed.

Multiple circuit patterns are formed by repetition of these preprocessing and post-processing steps.

In summary, as provided in detail herein, various advantages can be realized through use of the doubly-telecentric lens design. For example, with the doubly-telecentric lens design, the magnification is constant for all distances from the lens, and on both sides of the lens. Thus, for the pattern being observed along the target surface, if the distance from the lens changes, the image may go in and out of focus, but the position of the peaks and valleys relative to each other do not change in scale. This leads to simple algorithm development due to the consistency of the surface pattern. Further, the tilting of the second image sensor relative to the normal axis of the target surface as described satisfies the Scheimpflug condition, so that the image is focused across the whole image sensor. Moreover, the doubly-telecentric lens is an effective way to produce an image so as to inhibit keystone distortion. Accordingly, this lens design makes the software very simple, which reduces computation costs, and it makes the assembly very robust, which reduces the cost that would be associated with a precision assembly.

It is understood that although a number of different embodiments of the stage assembly 10A, the measurement system 18A and the first sensor system 26A have been illustrated and described herein, one or more features of any one embodiment can be combined with one or more features of one or more of the other embodiments, provided that such combination satisfies the intent of the present invention.

While a number of exemplary aspects and embodiments of a stage assembly 10A, a measurement system 18A and a first sensor system 26A have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A measuring device for monitoring movement of a first object relative to a second object along a first axis, along a second axis that is orthogonal to the first axis, and along a third axis that is orthogonal to the first and second axes, at least one of the first object and the second object including a target surface, the measuring device comprising:
   a first image sensor combination that captures a plurality of successive, first images of the target surface over time including a first, first image that is captured at a first time, and a second, first image that is captured at a second time that is different than the first time, the first image sensor combination including a first image sensor and a first lens assembly that are secured to one of the first object and the second object;
   a second image sensor combination that captures a plurality of successive, second images of the target surface over time including a first, second image that is captured at the first time, and a second, second image that is captured at the second time, the second image sensor combination including a second image sensor and a second lens assembly that are secured to one of the first object and the second object, the second image sensor being spaced apart from the first image sensor, and the second lens assembly being spaced apart from the first lens assembly; the second lens assembly having a second optical axis that is at a predetermined angle relative to normal to the target surface; and
   a computer including a processor that (i) compares the first, first image and the second, first image to determine a first offset between the first, first image and the second, first image; (ii) compares the first, second image and the second, second image to determine a second offset between the first, second image and the second, second image; and (iii) analyzes the first offset and the second offset to monitor movement of the first object relative to the second object over a first time interval along the first axis, along the second axis, and along the third axis.

2. The measuring device of claim 1 wherein the second optical axis is at an angle of between thirty degrees and sixty degrees relative to normal to the target surface.

3. The measuring device of claim 1 wherein the second optical axis is at an angle of between forty degrees and fifty degrees relative to normal to the target surface.

4. The measuring device of claim 1 wherein the second optical axis is at an angle of forty-five degrees relative to normal to the target surface.

5. The measuring device of claim 1 wherein the first lens assembly includes a first lens and a spaced apart second lens, the first lens assembly having a doubly telecentric configuration.

6. The measuring device of claim 5 wherein the second lens assembly includes a third lens and a spaced apart fourth lens, the second lens assembly having a doubly telecentric configuration.

7. The measuring device of claim 1 wherein the first lens assembly has a first optical axis that is perpendicular to the target surface.

8. The measuring device of claim 1 wherein the first lens assembly has a first optical axis that is at an angle of between thirty degrees and sixty degrees relative to normal to the target surface.

9. The measuring device of claim 8 further comprising a third image sensor combination that captures a plurality of third images of the target surface over time, the third image sensor combination including a third image sensor and a third lens assembly that are secured to one of the first object and the second object; wherein the third lens assembly has a third optical axis that is at an angle of between thirty degrees and sixty degrees relative to normal to the target surface.

10. The measuring device of claim 9 wherein the measuring device further monitors movement of the first object relative to the second object about the first axis, about the second axis and about the third axis.

11. The measuring device of claim 1 further comprising a light source that directs a light beam toward the target surface to illuminate at least a portion of the target surface.

12. A stage assembly for positioning a device along a first axis, along a second axis that is orthogonal to the first axis, and along a third axis that is orthogonal to the first and second axes, the stage assembly comprising:
   a base having a target surface;
   a stage that retains the device;
   a mover assembly that moves the stage relative to the base; and
   a first sensor system including the measuring device of claim 1 that monitors movement of the stage relative to the target surface along the first axis, along the second axis and along the third axis.

13. The stage assembly of claim 12 further comprising a second sensor system that senses the position of the stage relative to the target surface along the first axis, along the second axis and along the third axis, the second sensor system having a different design than the first sensor system.

14. An exposure apparatus including an illumination system, and the stage assembly of claim 12 that moves the stage relative to the illumination system.

15. A method for monitoring movement of a first object relative to a second object along a first axis, along a second axis that is orthogonal to the first axis, and along a third axis that is orthogonal to the first and second axes, at least one of the first object and the second object including a target surface, the method comprising:

capturing a plurality of successive, first images of the target surface over time including a first, first image that is captured at a first time, and a second, first image that is captured at a second time that is different than the first time with a first image sensor combination, the first image sensor combination including a first image sensor and a first lens assembly that are secured to one of the first object and the second object;

capturing a plurality of successive, second images of the target surface over time including a first, second image that is captured at the first time, and a second, second image that is captured at the second time with a second image sensor combination, the second image sensor combination including a second image sensor and a second lens assembly that are secured to one of the first object and the second object, the second image sensor being spaced apart from the first image sensor, and the second lens assembly being spaced apart from the first lens assembly; wherein the second lens assembly has a second optical axis that is at a predetermined angle relative to normal to the target surface;

comparing the first, first image and the second, first image with a computer including a processor to determine a first offset between the first, first image and the second, first image;

comparing the first, second image and the second, second image with the computer including the processor to determine a second offset between the first, second image and the second, second image; and analyzing the first offset and the second offset with the computer including the processor to monitor movement of the first object relative to the second object over a first time interval along the first axis, along the second axis, and along the third axis.

16. The method of claim 15 wherein the second optical axis is at an angle of between thirty degrees and sixty degrees relative to normal to the target surface.

17. The method of claim 15 wherein the second optical axis is at an angle of forty-five degrees relative to normal to the target surface.

18. The method of claim 15 wherein capturing the plurality of first images includes the first lens assembly having a first lens and a spaced apart second lens, the first lens assembly having a doubly telecentric configuration.

19. The method of claim 18 wherein capturing the plurality of second images includes the second lens assembly having a third lens and a spaced apart fourth lens, the second lens assembly having a doubly telecentric configuration.

20. The method of claim 15 wherein capturing the plurality of first images includes the first lens assembly having a first optical axis that is perpendicular to the target surface.

21. A method for positioning a device along a first axis, along a second axis that is orthogonal to the first axis, and along a third axis that is orthogonal to the first and second axes, the method comprising:

providing a base having a target surface;
retaining the device with a stage;
moving the stage relative to the base with a mover assembly; and
monitoring movement of the stage relative to the target surface along the first axis, along the second axis and along the third axis with a first sensor system utilizing the method of claim 15.

22. The method of claim 21 further comprising monitoring movement of the stage relative to the target surface along the first axis, along the second axis and along the third axis with a second sensor system, the second sensor system having a different design than the first sensor system.

23. A process for manufacturing a device that includes providing a substrate, positioning the substrate along the first axis, along the second axis and along the third axis with the method of claim 21, and forming an image to the substrate.

24. A measuring device for monitoring movement of a first object relative to a second object along a first axis, along a second axis that is orthogonal to the first axis, and along a third axis that is orthogonal to the first and second axes, at least one of the first object and the second object including a target surface, the measuring device comprising:

a first image sensor combination including a first image sensor and a first lens assembly that are secured to one of the first object and the second object, the first image sensor capturing first information for a plurality of successive, first images that include at least a portion of the target surface over time including for a first, first image that is captured at a first time, and for a second, first image that is captured at a second time that is different than the first time;

a second image sensor combination including a second image sensor and a second lens assembly that are secured to one of the first object and the second object, the second image sensor being spaced apart from the first image sensor, and the second lens assembly being spaced apart from the first lens assembly, the second image sensor capturing second information for a plurality of successive, second images that include at least a portion of the target surface over time including for a first, second image that is captured at the first time, and for a second, second image that is captured at the second time, the second lens assembly having an optical axis that is at a predetermined angle relative to normal to the target surface; and a computer including a processor that (i) compares the first information for the first, first image and the second, first image to determine a first offset between the first, first image and the second, first image; (ii) compares the second information for the first, second image and the second, second image to determine a second offset between the first, second image and the second, second image; and (iii) analyzes the first offset and the second offset to monitor movement of the first object relative to the second object over a first time interval along the first axis, along the second axis, and along the third axis.

25. A measuring device of for monitoring movement of a first object relative to a second object along a first axis, along a second axis that is orthogonal to the first axis, and along a third axis that is orthogonal to the first and second axes, at least one of the first object and the second object including a target surface, the measuring device comprising:

a first image sensor combination including a first image sensor and a first lens assembly that are secured to one of the first object and the second object, the first image sensor capturing first information for a plurality of first images that include at least a portion of the target surface;

a second image sensor combination including a second image sensor and a second lens assembly that are secured to one of the first object and the second object, the second image sensor capturing second information for a plurality of second images that include at least a portion of the target surface, the second lens assembly having an optical axis that is at a predetermined angle relative to normal to the target surface; and a computer including a processor that analyzes the first information and the second information to monitor movement of the first object relative to the second object along the first axis, along the second axis, and along the third axis; and wherein the first image sensor combination sums a first intensity of light in each of a plurality of rows of pixels in at least one of the first images to generate a first intensity signal; wherein the second image sensor combination sums a second intensity of light in each of a plurality of rows of pixels in at least one of the second images to generate a second intensity signal; and wherein the processor analyzes the first intensity signal and the second intensity signal to monitor movement of the first object relative to the second object along the first axis, along the second axis, and along the third axis.

26. The measuring device of claim 1 wherein the second image sensor is one of tilted and rotated with respect to the second optical axis.

27. The measuring device of claim 1 wherein the first image sensor combination further captures a third, first image at a third time that is different than the first time and the second time; wherein the second sensor combination further captures a third, second image at the third time; and wherein the computer (i) compares the second, first image and the third, first image to determine a third offset between the second, first image and the third, first image; (ii) compares the second, second image and the third, second image to determine a fourth offset between the second, second image and the third, second image; and (iii) analyzes the third offset and the fourth offset to monitor movement of the first object relative to the second object over a second time interval along the first axis, along the second axis, and along the third axis.

28. The measuring device of claim 1 wherein the first lens assembly includes a first optical axis that is at a first angle relative to normal to the target surface; and wherein the first angle is different than the predetermined angle of the second optical axis relative to normal to the target surface.

29. The method of claim 15 wherein the step of capturing a plurality of successive, second images includes the second image sensor being one of tilted and rotated with respect to the second optical axis.

30. The method of claim 15 wherein the step of capturing a plurality of successive, first images includes the first lens assembly including a first optical axis that is at a first angle relative to normal to the target surface; and wherein the step of capturing a plurality of successive, second images includes the predetermined angle of the second optical axis relative to normal to the target surface being different than the first angle.

* * * * *

UNITED STATES PATENT AND TRADEMARK OFFICE
CERTIFICATE OF CORRECTION

PATENT NO. : 10,812,695 B2
APPLICATION NO. : 15/264108
DATED : October 20, 2020
INVENTOR(S) : Jonathan K. Wells et al.

Page 1 of 1

It is certified that error appears in the above-identified patent and that said Letters Patent is hereby corrected as shown below:

In the Claims

Column 26, Line 52: Delete "of" after the word device.

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*